(12) United States Patent
Lee et al.

(10) Patent No.: US 10,199,434 B1
(45) Date of Patent: *Feb. 5, 2019

(54) THREE-DIMENSIONAL CROSS RAIL PHASE CHANGE MEMORY DEVICE AND METHOD OF MANUFACTURING THE SAME

(71) Applicant: SANDISK TECHNOLOGIES LLC, Plano, TX (US)

(72) Inventors: Yao-Sheng Lee, Tampa, FL (US); Senaka Krishna Kanakamedala, San Jose, CA (US); Raghuveer S. Makala, Campbell, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/888,645

(22) Filed: Feb. 5, 2018

(51) Int. Cl.
*H01L 27/24* (2006.01)
*H01L 45/00* (2006.01)

(52) U.S. Cl.
CPC ........ *H01L 27/249* (2013.01); *H01L 27/2427* (2013.01); *H01L 45/06* (2013.01);
(Continued)

(58) Field of Classification Search
CPC .............. H01L 27/249; H01L 27/2427; H01L 27/2409; H01L 27/2454; H01L 45/06;
(Continued)

(56) References Cited

U.S. PATENT DOCUMENTS 3,972,059 A    7/1976  DiStefano
5,535,156 A    7/1996  Levy et al.
(Continued)

FOREIGN PATENT DOCUMENTS

WO    WO 2009/091786 A1    7/2009

OTHER PUBLICATIONS

Kau, D.C. et al., "A Stackable Cross Point Phase Change Memory," IEEE, pp. IEDM09-617 to IEDM09-620, (2009).
(Continued)

*Primary Examiner* — Mohsen Ahmadi
(74) *Attorney, Agent, or Firm* — The Marbury Law Group PLLC

(57) ABSTRACT

A phase change memory device includes a vertical stack of multiple two-dimensional arrays of pillar structures. Each of the multiple two-dimensional arrays of pillar structures is located within a respective array level. Each two-dimensional array among the multiple two-dimensional arrays of pillar structures is contacted by a respective overlying one-dimensional array of conductive rails laterally extending along a first horizontal direction and a respective underlying one-dimensional array of conductive rails laterally extending along a second horizontal direction different from the first direction. Each pillar structure within the multiple two-dimensional arrays of pillar structures includes a phase change memory element and a selector element in a series connection with the phase change memory element. A first set of dielectric isolation structures having a first homogeneous composition vertically extends continuously through two vertically neighboring array levels.

15 Claims, 27 Drawing Sheets

(52) U.S. Cl.
CPC ...... *H01L 45/1233* (2013.01); *H01L 45/1253* (2013.01); *H01L 45/1608* (2013.01); *H01L 27/2409* (2013.01); *H01L 27/2454* (2013.01); *H01L 45/143* (2013.01); *H01L 45/144* (2013.01); *H01L 45/1675* (2013.01)

(58) Field of Classification Search
CPC ............. H01L 45/1233; H01L 45/1608; H01L 45/1675
See application file for complete search history.

(56) References Cited

U.S. PATENT DOCUMENTS

| | | | |
|---|---|---|---|
| 5,768,192 | A | 6/1998 | Eitan |
| 5,936,274 | A | 8/1999 | Forbes et al. |
| 6,011,725 | A | 1/2000 | Eitan |
| 6,015,738 | A | 1/2000 | Levy et al. |
| 6,285,055 | B1 | 9/2001 | Gosain et al. |
| 6,580,124 | B1 | 6/2003 | Cleeves et al. |
| 6,853,049 | B2 | 2/2005 | Herner |
| 6,881,994 | B2 | 4/2005 | Lee et al. |
| 7,285,464 | B2 | 10/2007 | Herner et al. |
| 7,378,870 | B2 | 5/2008 | Mouttet |
| 7,579,232 | B1 | 8/2009 | Ping et al. |
| 7,733,685 | B2 | 6/2010 | Scheuerlein et al. |
| 7,745,312 | B2 | 6/2010 | Herner et al. |
| 7,800,933 | B2 | 9/2010 | Kumar et al. |
| 7,830,697 | B2 | 11/2010 | Herner |
| 7,851,851 | B2 | 12/2010 | Mokhlesi et al. |
| 7,906,392 | B2 | 3/2011 | Dunton et al. |
| 7,923,812 | B2 | 4/2011 | Scheuerlein |
| 7,943,515 | B2 | 5/2011 | Scheuerlein |
| 8,097,498 | B2 | 1/2012 | Purayath et al. |
| 8,173,987 | B2 * | 5/2012 | Lung .................. G11C 13/0004 257/2 |
| 8,222,091 | B2 | 7/2012 | Purayath et al. |
| 8,345,472 | B2 | 1/2013 | Lee et al. |
| 8,349,681 | B2 | 1/2013 | Alsmeier et al. |
| 8,912,519 | B2 * | 12/2014 | Lee ....................... H01L 45/085 257/1 |
| 9,343,507 | B2 | 5/2016 | Takaki |
| 2005/0052915 | A1 | 3/2005 | Herner et al. |
| 2005/0073010 | A1 | 4/2005 | Lai et al. |
| 2006/0246606 | A1 | 11/2006 | Hsu et al. |
| 2006/0292301 | A1 | 12/2006 | Herner |
| 2007/0029607 | A1 | 2/2007 | Kouznetzov |
| 2007/0072360 | A1 | 3/2007 | Kumar et al. |
| 2008/0254576 | A1 | 10/2008 | Hsia et al. |
| 2008/0265238 | A1 * | 10/2008 | Chen ....................... H01L 45/06 257/3 |
| 2008/0316809 | A1 | 12/2008 | Herner |
| 2009/0179310 | A1 | 7/2009 | Dunton et al. |
| 2009/0181515 | A1 | 7/2009 | Herner et al. |
| 2010/0059796 | A1 | 3/2010 | Scheuerlein |
| 2010/0270529 | A1 * | 10/2010 | Lung .................. G11C 13/0004 257/4 |
| 2011/0037045 | A1 * | 2/2011 | Fukumizu ............. H01L 27/101 257/3 |
| 2012/0147648 | A1 | 6/2012 | Scheuerlein |
| 2012/0155161 | A1 | 6/2012 | Lee et al. |
| 2013/0221309 | A1 * | 8/2013 | Lee ....................... H01L 45/085 257/2 |

OTHER PUBLICATIONS

Wong, H.S. P. et al., "Phase Change Memory," Proceedings of the IEEE, vol. 98, No. 12, pp. 2201-2227, (2010).
U.S. Appl. No. 15/478,637, filed Apr. 4, 2017, Sandisk Technologies LLC.
U.S. Appl. No. 15/637,357, filed Jun. 29, 2017, Sandisk Technologies LLC.
U.S. Appl. No. 15/843,777, filed Dec. 15, 2017, Sandisk Technologies LLC.
U.S. Appl. No. 15/844,005, filed Dec. 15, 2017, Sandisk Tehcnologies LLC.

* cited by examiner

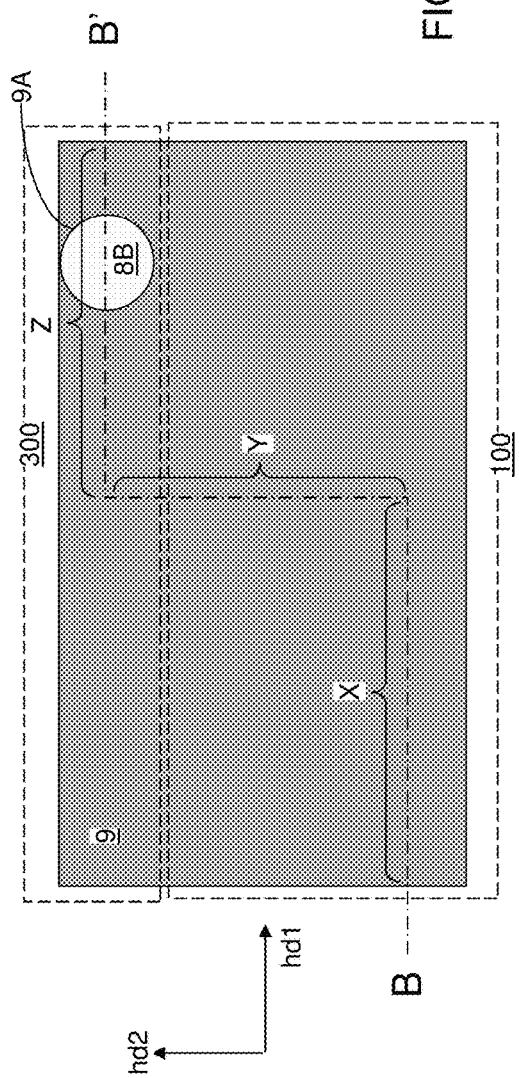
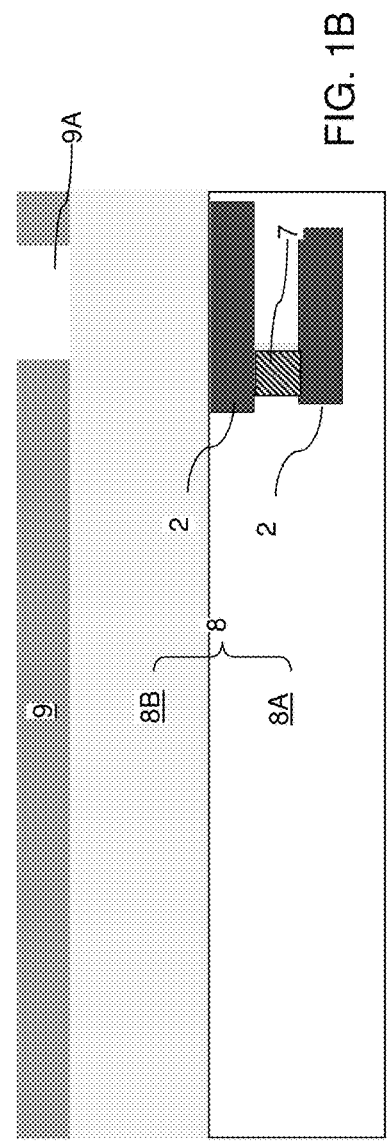

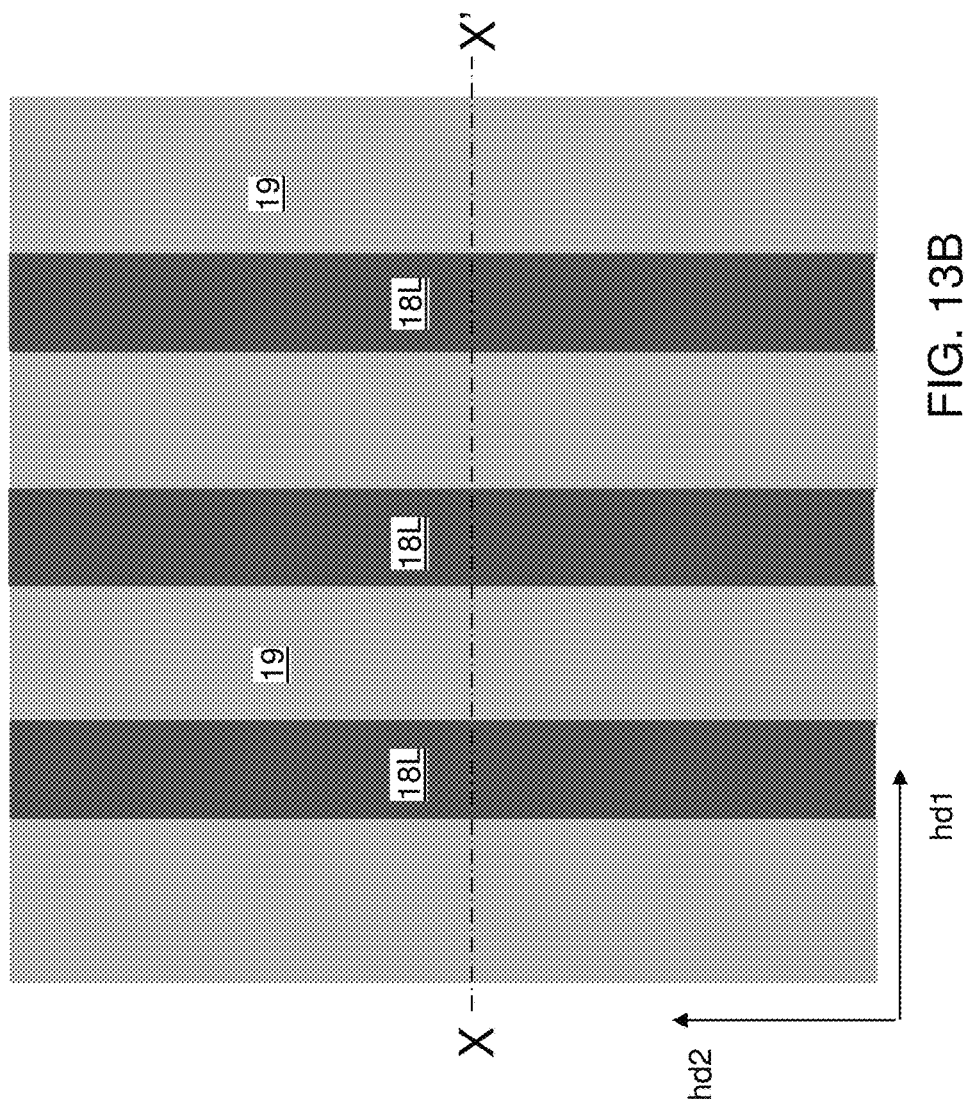

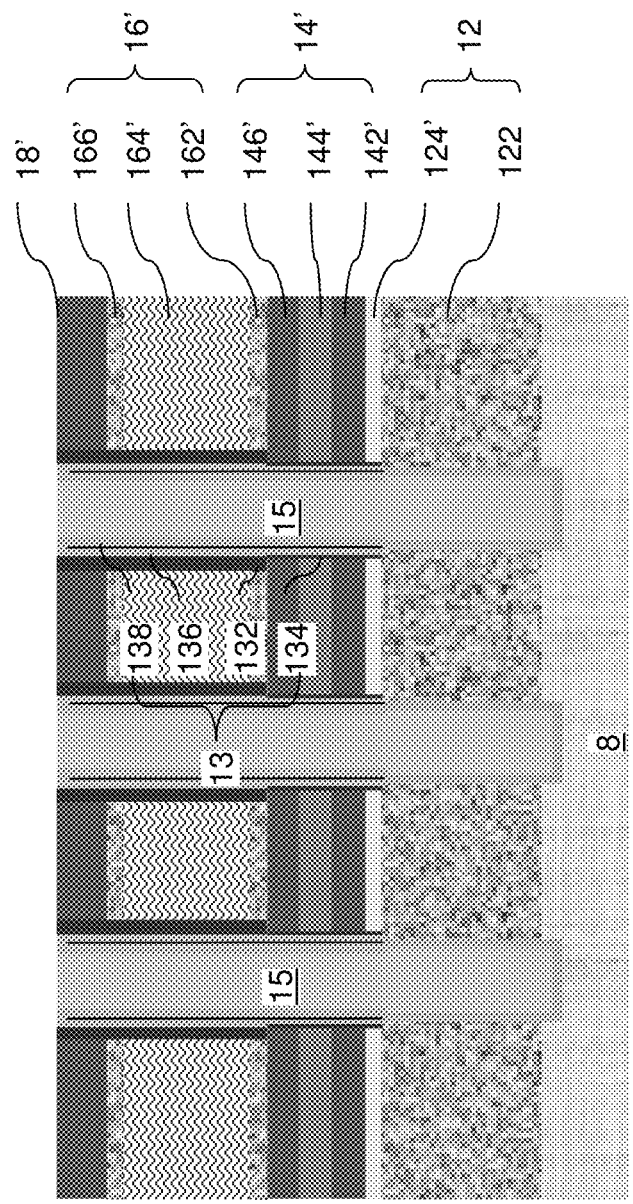

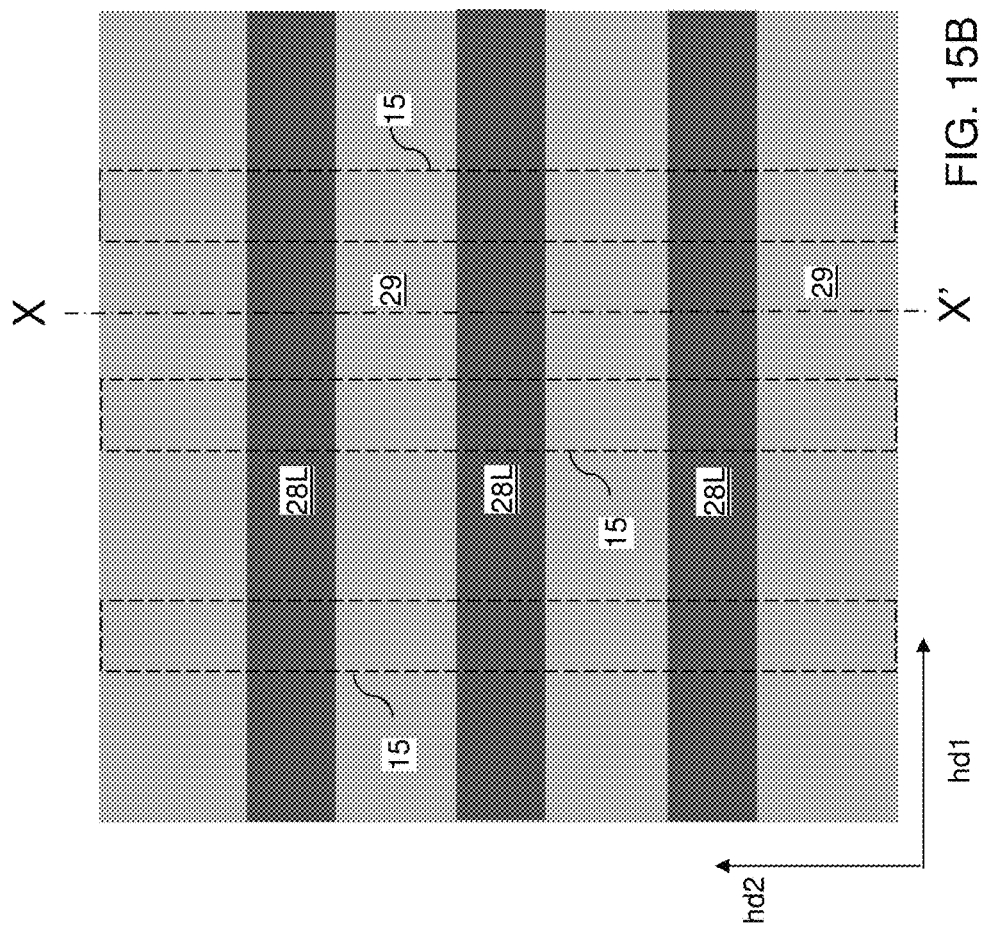

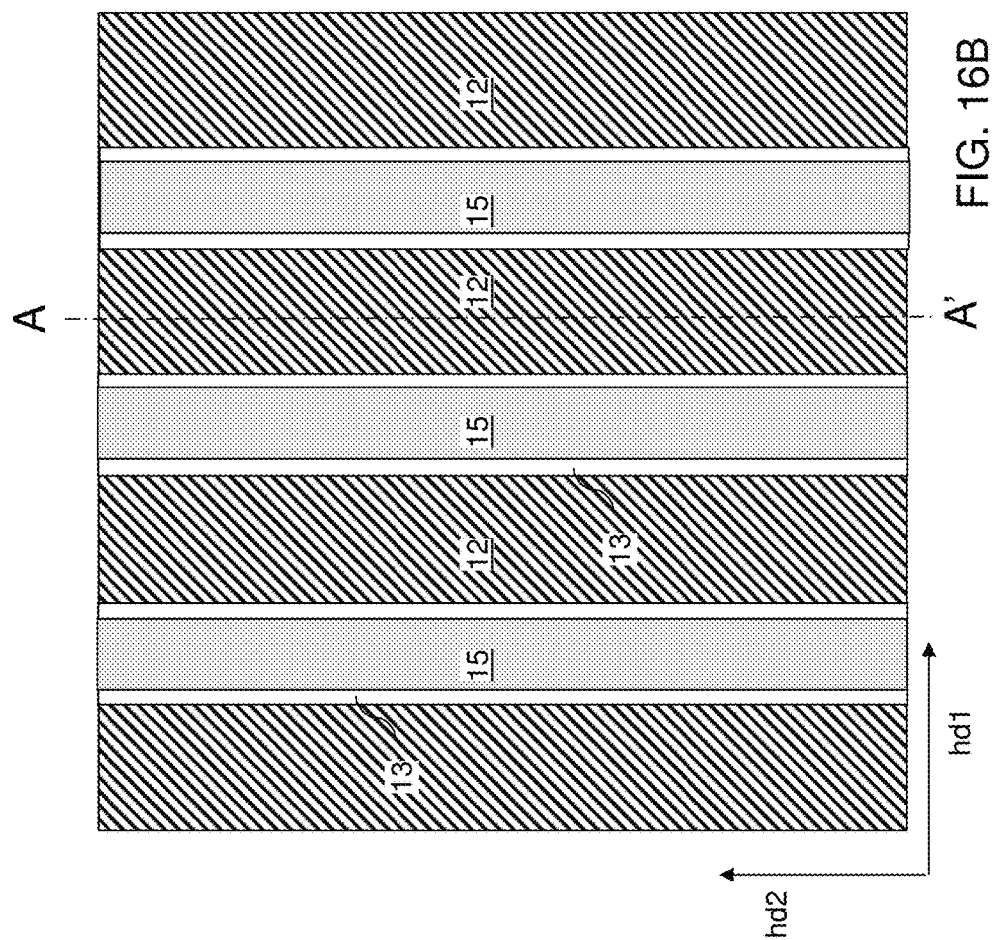

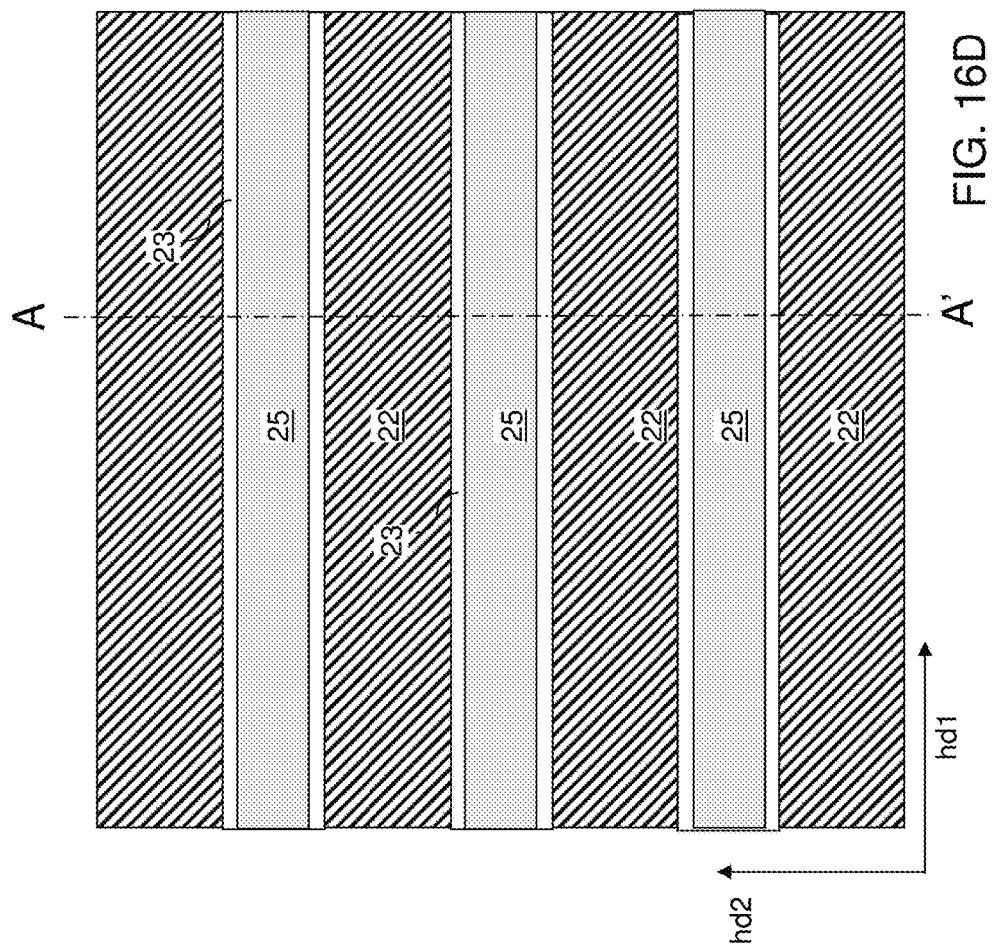

THREE-DIMENSIONAL CROSS RAIL PHASE CHANGE MEMORY DEVICE AND METHOD OF MANUFACTURING THE SAME

FIELD

The present disclosure relates generally to the field of semiconductor devices and specifically to three-dimensional cross-rail phase change memory device and methods of manufacturing the same.

BACKGROUND

A phase change material (PCM) memory device is a type of non-volatile memory device that stores information as a resistive state of a material that can be in different resistive states corresponding to different phases of the material. The different phases can include an amorphous state having high resistivity and a crystalline state having low resistivity (i.e., a lower resistivity than in the amorphous state).

The transition between the amorphous state and the crystalline state can be induced by controlling the rate of cooling after application of an electrical pulse that renders the phase change memory material in a first part of a programming process. The second part of the programming process includes control of the cooling rate of the phase change memory material. If rapid quenching occurs, the phase change memory material can cool into an amorphous high resistivity state. If slow cooling occurs, the phase change memory material can cool into a crystalline low resistivity state.

SUMMARY

According to an aspect of the present disclosure, a phase change memory device comprising a vertical stack of multiple two-dimensional arrays of pillar structures is provide. Each of the multiple two-dimensional arrays of pillar structures is located within a respective array level. Each two-dimensional array among the multiple two-dimensional arrays of pillar structures is contacted by a respective overlying one-dimensional array of conductive rails laterally extending along a first horizontal direction and a respective underlying one-dimensional array of conductive rails laterally extending along a second horizontal direction different from the first direction. Each pillar structure within the multiple two-dimensional arrays of pillar structures comprises a phase change memory element and a selector element in a series connection with the phase change memory element. A first set of dielectric isolation structures having a first homogeneous composition vertically extends continuously through two vertically neighboring array levels.

According to another aspect of the present disclosure, a method of forming a method of manufacturing a phase change memory device, which includes the steps of: forming first stacked rail structures laterally spaced in a first horizontal direction by first trenches over a substrate, wherein each of the first stacked rail structures comprises a first conductive rail, a first selector rail, and a first phase change material rail; forming first dielectric isolation structures in the first trenches; forming second stacked rail structures laterally spaced in a second horizontal direction different from the first horizontal direction by second trenches over the first stacked rail structures and the first dielectric isolation structures, wherein each of the second stacked rail structures comprises a second conductive rail, a second selector rail, and a second phase change memory rail; and vertically extending the second trenches through the first phase change material rails, the first selector rails, and upper portions of the first dielectric isolation structures to form first pillar structures including a respective first phase change memory element and a respective first selector element by patterning the first phase change material rails and the first selector rails.

BRIEF DESCRIPTION OF THE DRAWINGS

FIG. 1A is a top-down view of an exemplary structure for forming a three-dimensional phase change memory device of the present disclosure after application and patterning of a photoresist layer over a substrate according to an embodiment of the present disclosure.

FIG. 1B is a vertical cross-sectional view of the exemplary structure of FIG. 1A along the zig-zag plane B-B'.

FIG. 13B is a top-down view of the exemplary structure of FIG. 13A.

FIG. 14 is another vertical cross-sectional view of the exemplary structure at the processing step of FIG. 3 according to an embodiment of the present disclosure.

FIG. 15B is a top-down view of the exemplary structure of FIG. 15A.

FIG. 16B is a horizontal cross-sectional view of the exemplary structure along the horizontal plane B-B' of FIG. 16A. Plane A-A' corresponds to the view of FIG. 16A.

FIG. 16D is a horizontal cross-sectional view of the exemplary structure along the horizontal plane D-D' of FIG. 16A. Plane A-A' corresponds to the view of FIG. 16A.

DETAILED DESCRIPTION

Figure 2:
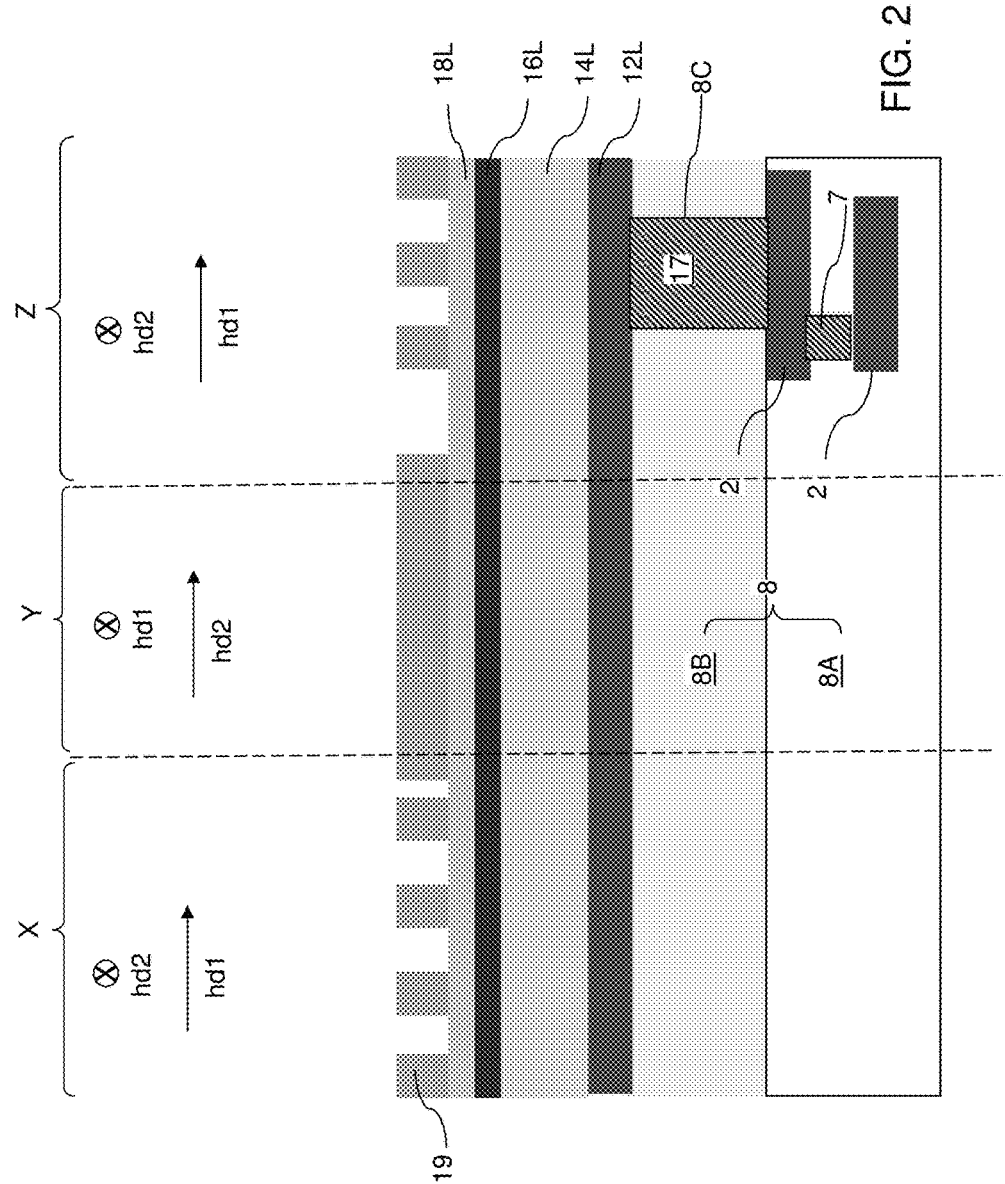
FIG. 2 is a vertical cross-sectional view of the exemplary structure after formation of at least one lower metal interconnect structure, a first stack of layers including a first conductive material layer, a first phase change memory layer, and a first selector layer, and a first patterned hard mask layer according to an embodiment of the present disclosure.

As discussed above, the present disclosure is directed to three-dimensional cross-rail phase change material memory devices and methods of manufacturing the same, the various aspects of which are described below. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. A same reference numeral refers to a same element or a similar element. Unless otherwise noted, elements with a same reference numeral are presumed to have a same material composition.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material.

A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Referring to FIGS. 1A and 1B, an exemplary structure for forming a three-dimensional phase change memory device is illustrated, which includes a substrate 8. FIG. 1A is a top-down view, and FIG. 1B is a vertical cross-sectional view employing a Z-shaped cut plane, or a zig-zag cut plane, which is employed in subsequent vertical cross-sectional views. The substrate 8 can include a lower substrate insulating layer 8A and an upper substrate insulating layer 8B. Additional layers such as a semiconductor material layer or semiconductor water (e.g., silicon wafer) and at least one additional substrate insulating layer may be present underneath the lower substrate insulating layer 8A. In one embodiment, semiconductor devices such as field effect transistors may be provided on the semiconductor material layer or semiconductor wafer, and the at least one additional substrate insulating layer may include metal interconnect structures that provide electrically conductive paths among the semiconductor devices and to metal interconnect structures (2, 7) embedded within the lower substrate insulating layer 8A. The metal interconnect structures (2, 7) embedded within the lower substrate insulating layer 8A and the at least one additional substrate insulating layer can include line structures 2 and via structures 7. The upper substrate insulating layer 8B functions as an insulating structure that electrically isolates devices to be formed thereupon from devices and metal interconnect structures (2, 7) underneath. The upper substrate insulating layer 8B includes a dielectric material such as silicon oxide, and can have a thickness in a range from 50 nm to 500 nm, although lesser and greater thicknesses can also be employed.

The exemplary structure includes a memory array region 100 and a peripheral region 300. In one embodiment, the memory array region 100 can have a rectangular area in which memory cells are subsequently formed, and the peripheral region 300 can be located at least on two sides, such as four sides, of the memory array region 100 to provide electrical connection to word lines and bit lines that laterally extend from the memory array region 100. The sides of the rectangular area can be parallel to a first horizontal direction hd1 or a second horizontal direction hd2 that is perpendicular to the first horizontal direction hd1. A photoresist layer 9 can be applied over the top surface of the upper substrate insulating layer 8B, and can be patterned to form openings 9A in areas in which a conductive via structure is to be subsequently formed through the upper substrate insulating layer 8B.

Referring to FIG. 2, regions X, Y and Z represent vertical cross-sectional views along the x-direction (e.g., the first horizontal direction hd1), the y-direction (e.g., the second horizontal direction hd2, and the zia direction (e.g., the first horizontal direction hd1 in the peripheral region 300) along respective lines X, Y and Z in FIG. 1A. An anisotropic etch can be performed employing the photoresist layer 9 as an etch mask to form at least one cavity 8C. Top surfaces of underlying metal interconnect structures (2, 7) can be physically exposed underneath the at least one cavity. The photoresist layer 9 is removed, for example, by ashing. The at least one cavity 8C filled with a conductive material to form at least one lower level metal interconnect structure 17, which may include a substrate level via structure.

A first stack of layers (12L, 14L, 16L, 18L) is formed over the substrate 8. The first stack of layers (12L, 14L, 16L, 18L) can include a first conductive material layer 12L, a first selector layer 14L, a first phase change memory layer 16L, and a first barrier material layer 18L. A first hard mask layer 19 can be formed thereupon. The order of the first selector layer 14L and the first phase change memory layer 16L can be reversed such that layer 16 is formed over layer 14.

The first conductive material layer 12L includes at least one conductive material layer, which can be at least one metallic material layer. For example, the first conductive material layer 12L can include a layer stack, from bottom to top, of a metal layer (such as a tungsten layer) and a metal nitride layer (such as a tungsten nitride layer or a titanium nitride layer). The thickness of the first conductive material layer 12L can be in a range from 20 nm to 100 nm, although lesser and greater thicknesses can also be employed.

The first selector layer 14L includes a non-Ohmic material that provides electrical connection of electrical isolation depending on the magnitude and/or the polarity of an externally applied voltage bias thereacross. In one embodiment, the first selector layer 14L includes at least one threshold switch material layer. The at least one threshold switch material layer includes any suitable threshold switch material which exhibits non-linear electrical behavior, such as an ovonic threshold switch material or a diode threshold switch material (e.g., materials for p-n semiconductor diode, p-i-n semiconductor diode, Schottky diode or metal-insulator-metal diode). As used herein, an ovonic threshold switch (OTS) is a device that does not crystallize in a low resistance state under a voltage above the threshold voltage, and reverts back to a high resistance state when not subjected to a voltage above the threshold voltage across the OTS material layer. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage. An ovonic threshold switch material (OTS material) can be non-crystalline (for example, amorphous) in a high resistance state, and can remain non-crystalline (for example, remain amorphous) in a low resistance state during application of a voltage above its threshold voltage across the OTS material. The OTS material can revert back to the high resistance state when the high voltage above its threshold voltage is removed. Throughout the resistive state changes, the ovonic threshold switch material can remain non-crystalline (e.g., amorphous). In one embodiment, the ovonic threshold switch material can comprise a chalcogenide material which exhibits hysteresis in both the write and read states. The chalcogenide material may be a GeTe compound or a Ge—Se compound doped with a dopant selected from As, N, and C, such as a Ge—Se—As compound semiconductor material. The ovonic threshold switch material layer can include any ovonic threshold switch material. In one embodiment, the ovonic threshold switch material layer can include, and/or can consist essentially of, a GeSeAs alloy, a GeSe alloy, a SeAs alloy, a GeTe alloy, or a SiTe alloy.

In one embodiment, the material of the ovonic threshold switch material layer can be selected such that the resistivity of the ovonic threshold switch material layer decreases at least by two orders of magnitude (i.e., by more than a factor of 100) upon application of an external bias voltage that exceeds a critical bias voltage magnitude (also referred to as a threshold voltage or $V_t$). In one embodiment, the composition and the thickness of the ovonic threshold switch material layer can be selected such that the critical bias voltage magnitude can be in a range from 1 V to 4 V, although lesser and greater voltages can also be employed for the critical bias voltage magnitude. The thickness of the ovonic threshold switch material layer can be, for example, in a range from 1 nm to 40 nm, such as from 2 nm to 20 nm, although lesser and greater thicknesses can also be employed.

The first selector layer 14L can include an optional upper barrier material layer overlying the ovonic threshold switch material layer and an optional lower barrier material layer underlying the ovonic threshold switch material layer. The optional upper and/or lower barrier material layers include a material that suppresses diffusion of the material of the ovonic threshold switch material layer. For example, the optional upper and/or lower barrier material layers can include amorphous carbon or diamondlike carbon (DLC).

Alternatively or additionally, the first selector layer 14L may include alternative non-Ohmic material layer or layers, such as a p-n or p-i-n junction diode layers (e.g., p and n type doped semiconductor layers). In this case, the first selector layer 14L becomes conductive only under electrical bias condition of one polarity, and becomes electrically non-conductive under electrical bias condition of the opposite polarity.

The first phase change memory layer 16L includes at least a layer of a phase change memory material, i.e., a phase change memory material layer. As used herein, a "phase change memory material" refers to a material having at least two different phases providing different resistivity. The at least two different phases can be provided, for example, by controlling the rate of cooling from a heated state to provide an amorphous state having a higher resistivity and a polycrystalline state having a lower resistivity. In this case, the higher resistivity state of the phase change memory material can be achieved by faster quenching of the phase change memory material after heating to an amorphous state, and the lower resistivity state of the phase change memory material can be achieved by slower cooling of the phase change memory material after heating to the amorphous state.

Exemplary phase change memory materials include, but are not limited to, germanium antimony telluride compounds, such as $Ge_2Sb_2Te_5$ (GST), germanium antimony compounds, indium germanium telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the phase change memory material layer can include, and/or can consist essentially of, a material selected from a germanium antimony telluride compound, a germanium antimony compound, an indium germanium telluride compound, an aluminum selenium telluride compound, an indium selenium telluride compound, a silicon telluride compound, or an aluminum indium selenium telluride compound. The thickness of the phase change memory material layer can be in a range from 1 nm to 40 nm, such as from 2 nm to 20 nm, although lesser and greater thicknesses can also be employed.

The phase change memory layer 16L may include an optional upper conducive liner and/or an optional lower conductive liner. The optional upper and/or lower conductive liners, if present, includes a thin layer of metal or metal nitride. For example, the optional upper and/or lower conductive liners can be a respective metal layer such as a tungsten layer or a metal compound layer such as a titanium nitride layer. The thickness of each of the optional upper and lower metal liners can be in a range from 2 nm to 10 nm, although lesser and greater thicknesses can also be employed.

The first barrier material layer 18L includes a barrier material such as amorphous carbon. The first barrier material layer 18L provides effective encapsulation of the underlying phase change memory material. The thickness of the first barrier material layer 18L can be in a range from 0.5 nm to 10 nm, such as from 1 nm to 5 nm, although lesser and grater thicknesses can also be employed. The first hard mask layer 19 can include any suitable hard mask material, such as silicon nitride.

The first hard mask layer 19 can be lithographically patterned to form a line and space pattern. The lines and spaces of the patterned first hard mask layer 19 can laterally extend along the second horizontal direction hd2. The line and spacer pattern of the first hard mask layer 19 can have a periodic pattern with a periodicity along the first horizontal direction hd1.

Figure 3:
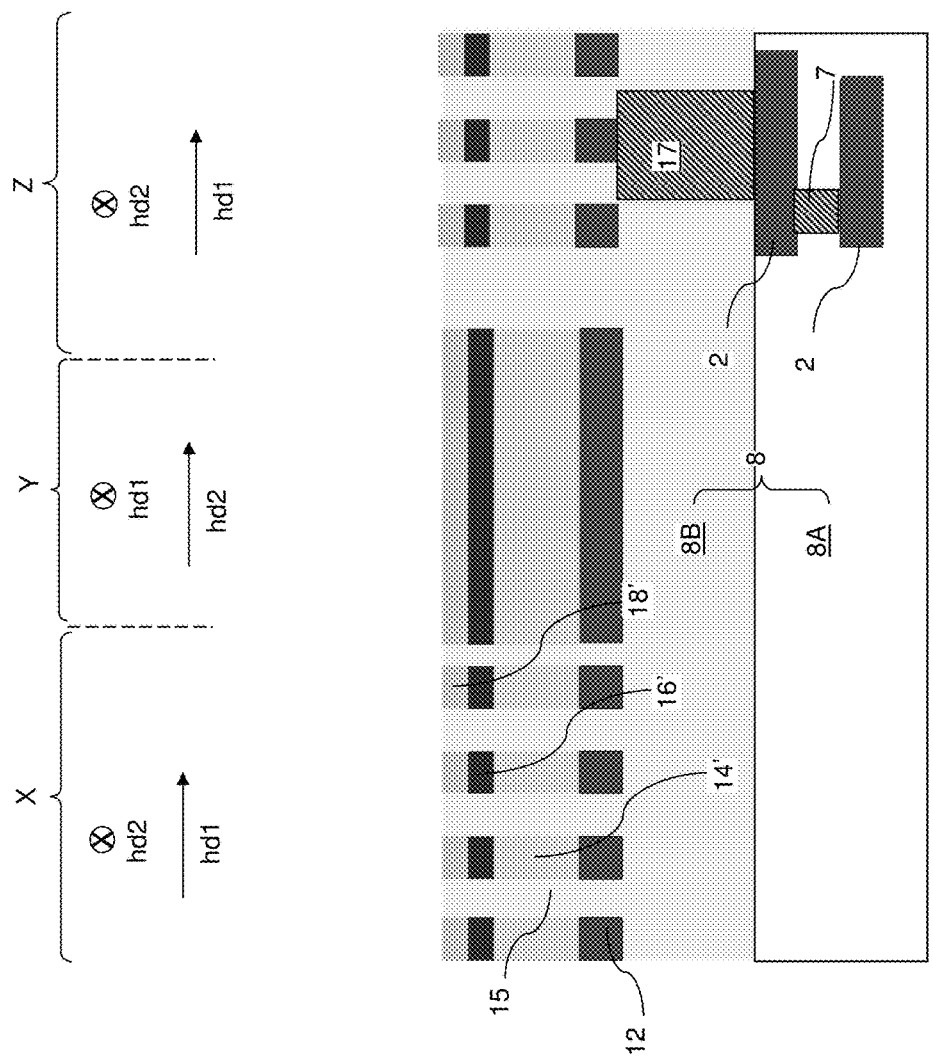
FIG. 3 is a vertical cross-sectional view of the exemplary structure after formation of first stacked rail structures laterally spaced by first trenches and subsequent formation of first dielectric isolation structures in the first trenches according to an embodiment of the present disclosure.

Referring to FIG. 3, the stack of the first conductive material layer 12L, the first selector layer 14L, the first phase change memory layer 16L, and the first barrier material layer 18L can be anisotropically etched employing the first hard mask layer 19 as an etch mask. First trenches are formed through the stack of the first conductive material layer 12L, the first selector layer 14L, the first phase change memory layer 16L, and the first barrier material layer 18L in areas that are not covered by the first hard mask layer 19. Remaining portions of the stack of the first conductive material layer 12L, the first selector layer 14L, the first phase change memory layer 16L, and the first barrier material layer 18L constitute first stacked rail structures (12, 14', 16', 18').

As used herein, a "rail" or a "rail structure" refers to a structure that extends along a lengthwise direction. In one embodiment, the rail or rail structure can have a uniform cross-sectional shape within planes that are perpendicular to the lengthwise direction that is invariant under translation along the lengthwise direction. As used herein, a "stacked rail" or a "stacked rail structure" refers to a contiguous stack of at least two rails that laterally extend along a same lengthwise direction. As used herein, a "contiguous stack" is a stack of two or more contiguous (e.g., adjacent) elements which directly contact either other or indirectly contact each other through one or more other elements of the stack within the boundaries of the stack.

Each first stacked rail structure (12, 14, 16, 18) includes, from bottom to top, a first conductive rail 12 that is a patterned portion of the first conductive material layer 12L, a first selector rail 14' that is a patterned portion of the first selector layer 14L, a first phase change memory rail 16' that includes a patterned portion of the first phase change memory layer 16L, and a first barrier rail 18' that includes a patterned portion of the first barrier material layer 18. The first stacked rail structures (12, 14', 16', 18') laterally extend along the second horizontal direction hd2, are laterally spaced among one another by the first trenches, and are located over the substrate 8.

A dielectric material such as silicon oxide can be conformally deposited in the first trenches. Excess portions of the dielectric material can be removed from above the first stacked rail structures (12, 14', 16', 18') by a planarization process such as chemical mechanical planarization or a recess etch. Remaining portions of the dielectric material in the first trenches constitute first dielectric isolation structures 15. The first dielectric isolation structures 15 can be rail structures that laterally extend along the second horizontal direction hd2. In one embodiment, the first dielectric isolation structures 15 can have a homogeneous composition throughout, which is herein referred to as a first homogeneous composition.

Figure 4:
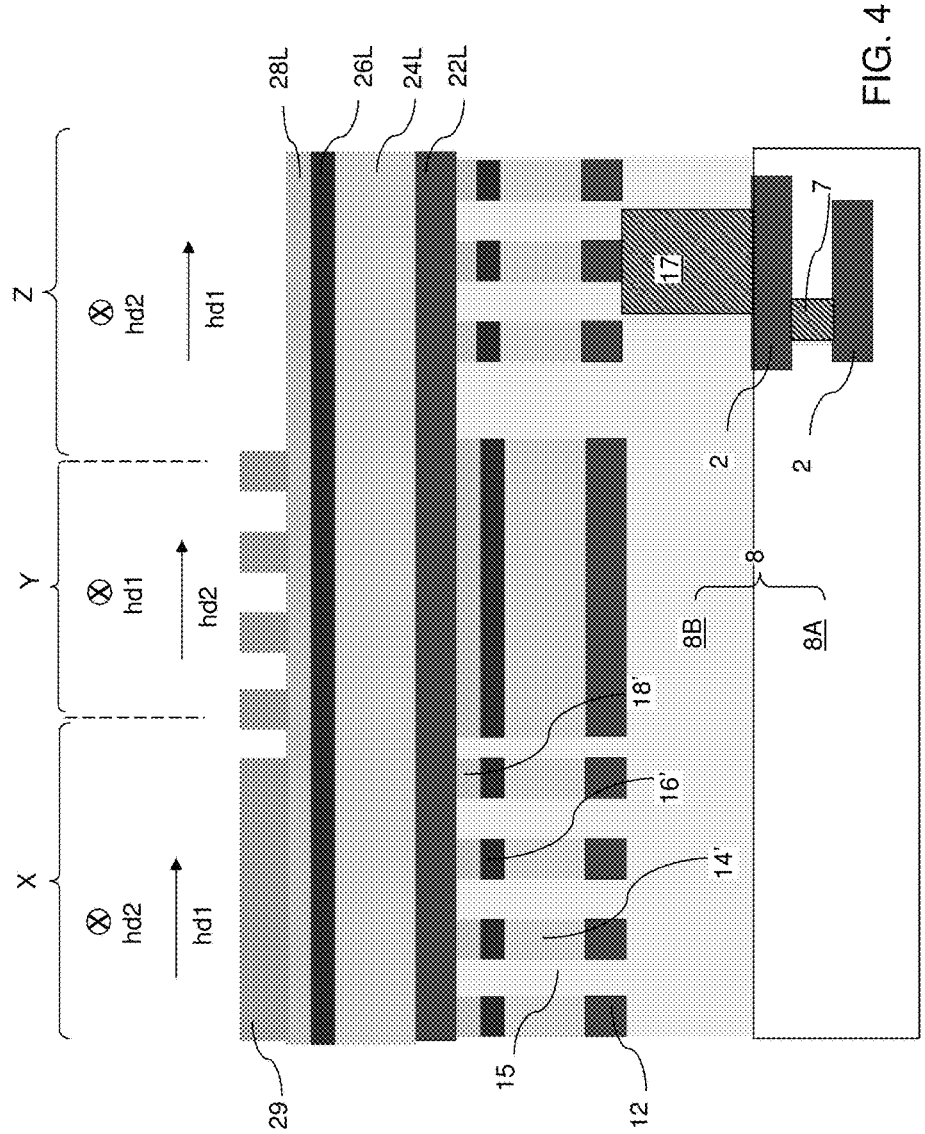
FIG. 4 is a vertical cross-sectional view of the exemplary structure after formation of a second stack of layers including a second conductive material layer, a second phase change memory layer, and a second selector layer, and a second patterned hard mask layer according to an embodiment of the present disclosure.

Referring to FIG. 4, a second stack of layers (22L, 24L, 26L, 28L) is formed over the first stacked rail structures (12, 14', 16', 18') and the first dielectric isolation structures 15. The second stack of layers (22L, 24L, 26L, 28L) can include a second conductive material layer 22L, a second selector layer 24L, a second phase change memory layer 26L, and a second barrier material layer 28L. A second hard mask layer 29 can be formed thereupon. The order of the second selector layer 24L and the second phase change memory layer 26L can be reversed such that layer 26 is formed over layer 24.

The second conductive material layer 22L includes at least one conductive material layer, which can be any of the material that can be employed for the first conductive material layer 12L. For example, the second conductive material layer 22L can include a layer stack, from bottom to top, of a metal layer (such as a tungsten layer) and a metal nitride layer (such as a tungsten nitride layer or a titanium nitride layer). The thickness of the second conductive material layer 22L can be in a range from 20 nm to 200 nm, although lesser and greater thicknesses can also be employed.

The second selector layer 24L can include any of the materials that can be employed for the first selector layer 14L, and can have the same thickness as the first selector layer 14L. The second phase change memory layer 26L can include any of the materials that can be employed for the first phase change memory layer 16L, and can have the same thickness as the first phase change memory layer 16L. The second barrier material layer 28L can include any of the materials that can be employed for the first barrier material layer 18L, and can have the same thickness as the first barrier material layer 18L. The second hard mask layer 29 can include any suitable hard mask material, such as silicon nitride.

The second hard mask layer 29 can be lithographically patterned to form a line and space pattern. The lines and spaces of the patterned second hard mask layer 29 can laterally extend along the first horizontal direction hd1, which is perpendicular to the lengthwise direction of the first stacked rail structures (12, 14', 16', 18'). The line and spacer pattern of the second hard mask layer 29 can have a periodic pattern with a periodicity along the second horizontal direction hd2.

Figure 5:
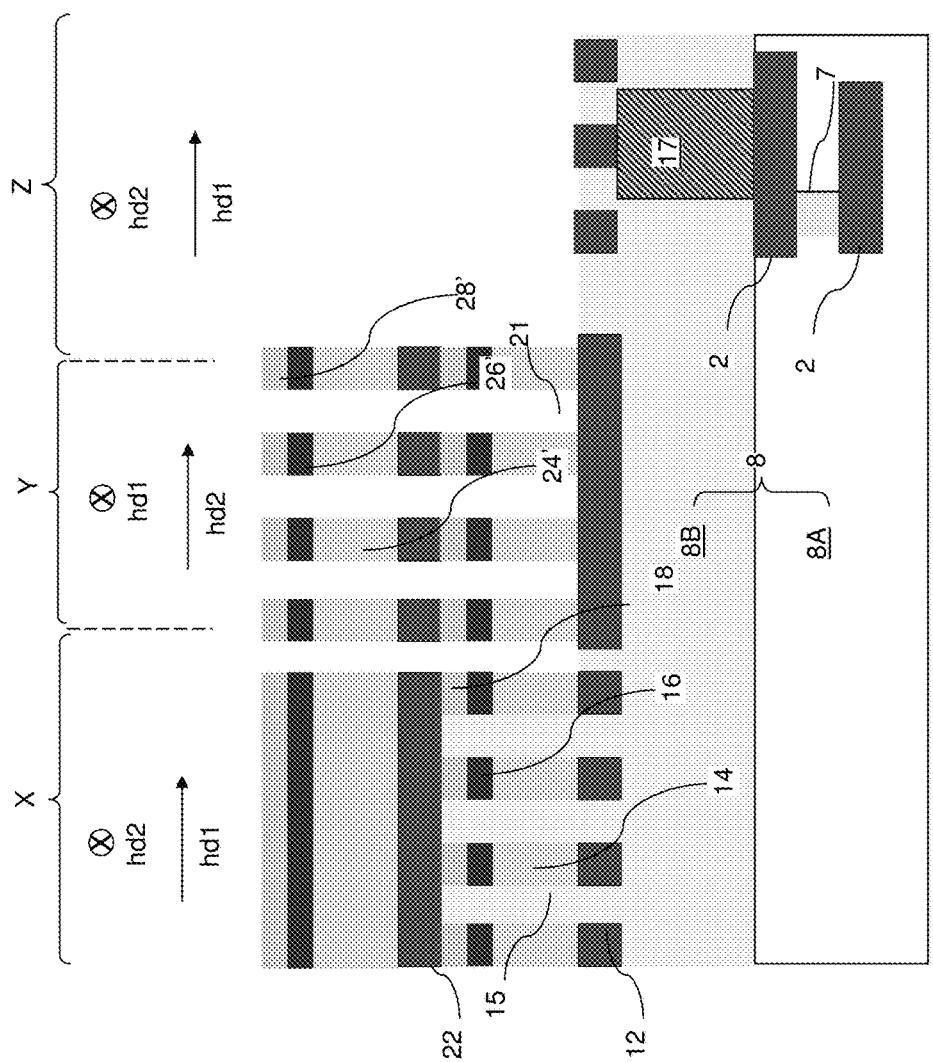
FIG. 5 is a vertical cross-sectional view of the exemplary structure after formation of second stacked rail structures laterally spaced by second trenches according to an embodiment of the present disclosure.

Referring to FIG. 5, the stack of the second conductive material layer 22L, the second selector layer 24L, the second phase change memory layer 26L, and the second barrier material layer 28L, the first barrier rails 18', the first phase change memory rails 16', the first selector rails 14', and the first dielectric isolation structures 15 can be anisotropically etched employing the second hard mask layer 29 as an etch mask. Second trenches 21 are formed through the stack of the second conductive material layer 22L, the second selector layer 24L, the second phase change memory layer 26L, and the second barrier material layer 28L, and through the first barrier rails 18', the first phase change memory rails 16', the first selector rails 14', and the first dielectric isolation structures 15 in areas that are not covered by the second hard mask layer 29.

Remaining portions of the stack of the second conductive material layer 22L, the second selector layer 24L, the second phase change memory layer 26L, and the second barrier material layer 28L constitute second stacked rail structures (22, 24', 26', 28'). Each second stacked rail structure (22, 24', 26', 28') includes, from bottom to top, a second conductive rail 22 that is a patterned portion of the second conductive material layer 22L, a second selector rail 24' that is a patterned portion of the second selector layer 24L, a second phase change memory rail 26' that includes a patterned portion of the second phase change memory layer 26L, and a second barrier rail 28' that includes a patterned portion of the second barrier material layer 28. The second stacked rail structures (22, 24', 26', 28') laterally extend along the first horizontal direction hd1, and are laterally spaced among one another by the second trenches 21 in the second horizontal direction hd2.

After patterning of the second barrier rails 28', the second phase change memory rails 26', the second selector rails 24', and the second conductive rails 22, the anisotropic etch process vertically extends the second trenches 21 through the first barrier rails 18', the first phase change material rails 16', the first selector rails 14', and upper portions of the first dielectric isolation structures 15. Each stack of a first barrier rail 18', a first phase change memory rail 16', and a first selector rail 14' is divided into a respective row of first pillar structures (14, 16, 18). As used herein, a "pillar" or a "pillar structure" refers to a structure that extends vertically such that each sidewall is vertical or substantially vertical. As used herein, a surface is "substantially vertical" if the angle between the surface and a vertical line is less than 5 degrees. In one embodiment, if a pillar structure has vertical sidewalls, the horizontal cross-sectional area of the pillar structure can be invariant under translation of the horizontal plane of the cross-sectional view along the vertical direction.

Each first pillar structure (14, 16, 18) includes a first phase change memory element 16 that is a patterned portion of a first phase change memory rail 16' and a first selector element 14 that is a patterned portion of a first selector rail 14', and optionally includes a first barrier element 18 that is a patterned portion of a first barrier rail 18'. Each first selector element 14 can be in a series connection with a first phase change memory element 16 within the same first pillar structure (14, 16, 18). Each first phase change memory element 16 can be a pillar structure having a rectangular horizontal cross-sectional shape. Each first selector element 14 can be a pillar structure having a rectangular horizontal cross-sectional shape. Each first barrier element 18 can be a pillar structure having a rectangular horizontal cross-sectional shape. Each row of first pillar structures (14, 16, 18) can be laterally spaced among one another by the second trenches 21. The top surfaces of the first conductive rails 12 can function as an etch stop surface. Thus, the etch process that forms the second trenches 21 can stop on the top surfaces of the first conductive rails 12, and therefore, the first conductive rails 12 are not divided by the second trenches 21. The first conductive rails 12 may comprise first word lines which extend in the second horizontal direction hd2.

Each first pillar structure (14, 16, 18) can have a respective rectangular horizontal cross-sectional shape. A two-dimensional array of first pillar structures (14, 16, 18) is formed between the first conductive rails 12 and the second conductive rails 22. The level of the first pillar structures (14, 16, 18) defines a first array level that includes a first two-dimensional array of memory elements, each including a respective set of a first phase change memory element 16 and a first selector element 14 in a series connection. The second conductive rails 22 may comprise first bit lines which extend in the first horizontal direction hd1.

Each first dielectric isolation structures 15 can be etched through the levels of the first pillar structures (14, 16, 18), and not etched at the level of the first conductive rails 12. Each remaining portion of a first dielectric isolation structure 15 can include a laterally extending portion located at the level of the first conductive rails 12 and contacting at least one first conductive rail 12, and vertical portions protruding upward from the laterally extending portion and contacting a respective neighboring pair of first pillar structures (14, 16, 18). As such, each first dielectric isolation structure 15 can have a fork configuration with fingers that separate neighboring pairs of first pillar structures (14, 16, 18). The second trenches 21 laterally separate neighboring pairs of forks, i.e., vertically protruding portions, of each first dielectric isolation structure 15.

Figure 6:
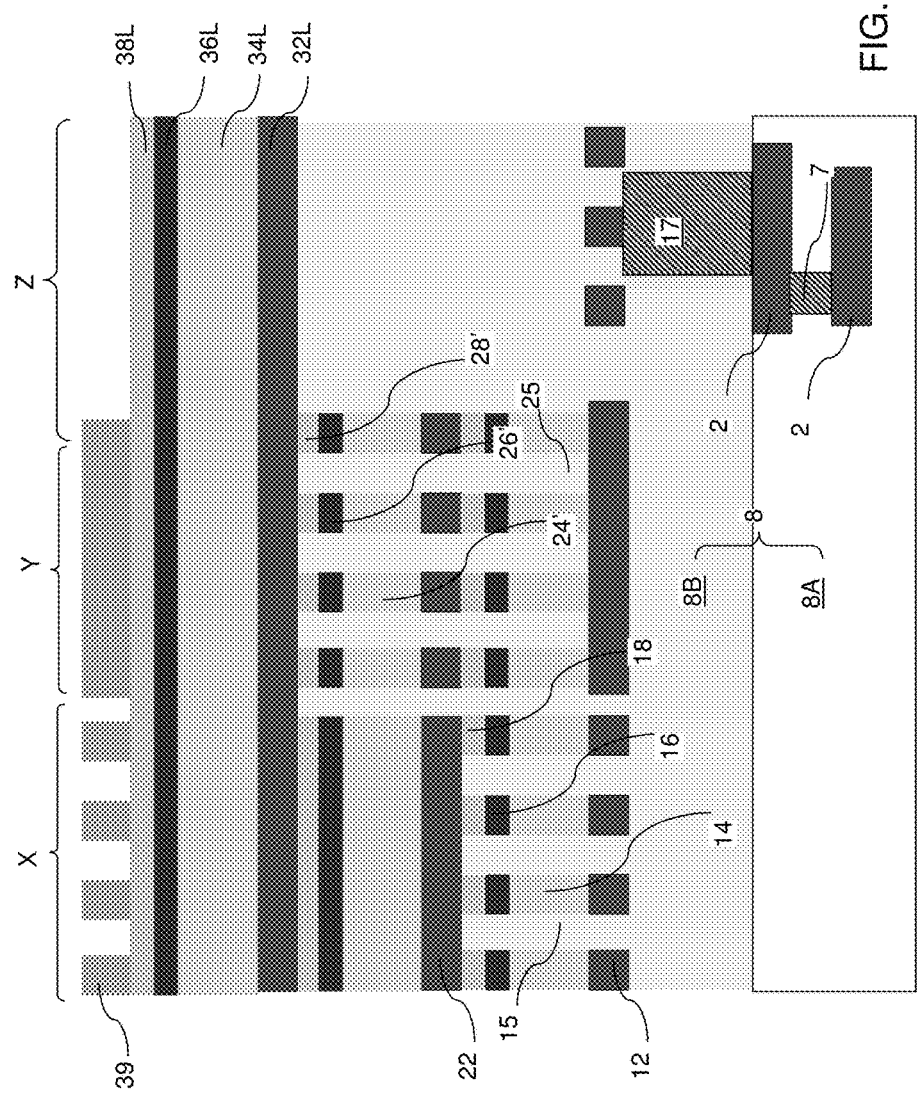
FIG. 6 is a vertical cross-sectional view of the exemplary structure after formation of second dielectric isolation structures, a third stack of layers including a third conductive material layer, a third phase change memory layer, and a third selector layer, and a third patterned hard mask layer according to an embodiment of the present disclosure.

Referring to FIG. 6, a dielectric material such as silicon oxide can be conformally deposited in the second trenches 21. Excess portions of the dielectric material can be removed from above the second stacked rail structures (22, 24', 26', 28') by a planarization process such as chemical mechanical planarization or a recess etch. Remaining portions of the dielectric material in the second trenches 21 constitute second dielectric isolation structures 25. The second dielectric isolation structures 25 can be rail structures that laterally extend along the first horizontal direction hd1. The second dielectric isolation structures 25 vertically extend from the level of the second stacked rail structures (22, 24', 26', 28') to top surfaces of the first conductive rails 12. Specifically, the second dielectric isolation structures 25 vertically extend from a horizontal plane including the topmost surfaces of the second stacked rail structures (22, 24', 26', 28') to top surfaces of the first conductive rails 12. In one embodiment, the second dielectric isolation structures 25 can have a homogeneous composition throughout, which is herein referred to as a second homogeneous composition. The set of first dielectric isolation structures 25 can vertically extend continuously through two vertically neighboring array levels. Each of the first pillar structures (14, 16, 18) contacts a top surface of a respective one of the first conductive rails 12 and a bottom surface of a respective one of the second conductive rails 22.

A third stack of layers (32L, 34L, 36L, 38L) is formed over the second stacked rail structures (22, 24', 26', 28') and the second dielectric isolation structures 25. The third stack of layers (32L, 34L, 36L, 38L) can include a third conductive material layer 32L, a third selector layer 34L, a third phase change memory layer 36L, and a third barrier material layer 38L. A third hard mask layer 39 can be formed thereupon. The order of the third selector layer 34L and the third phase change memory layer 36L can be reversed such that layer 36 is formed over layer 34.

The third conductive material layer 32L includes at least one conductive material layer, which can be any of the material that can be employed for the first and second conductive material layers (12L, 22L), and can have the same thickness as the first or second conductive material layer (12L or 22L). The third selector layer 34L can include any of the materials that can be employed for the first and second selector layers (14L, 24L), and can have the same thickness as the first or second selector layer (14L or 24L). The third phase change memory layer 36L can include any of the materials that can be employed for the first and second phase change memory layers (16L, 26L), and can have the same thickness as the first or second phase change memory layer (16L or 26L). The third barrier material layer 38L can include any of the materials that can be employed for the first or second barrier material layer (18L, 28L), and can have the same thickness as the first or second barrier material layer (18L or 28L).

The third hard mask layer 39 can be lithographically patterned to form a line and space pattern. The lines and spaces of the patterned third hard mask layer 39 can laterally extend along the second horizontal direction hd2, which is perpendicular to the lengthwise direction of the second stacked rail structures (22, 24', 26', 28'). The line and spacer pattern of the third hard mask layer 39 can have a periodic pattern with a periodicity along the first horizontal direction hd1.

Figure 7:
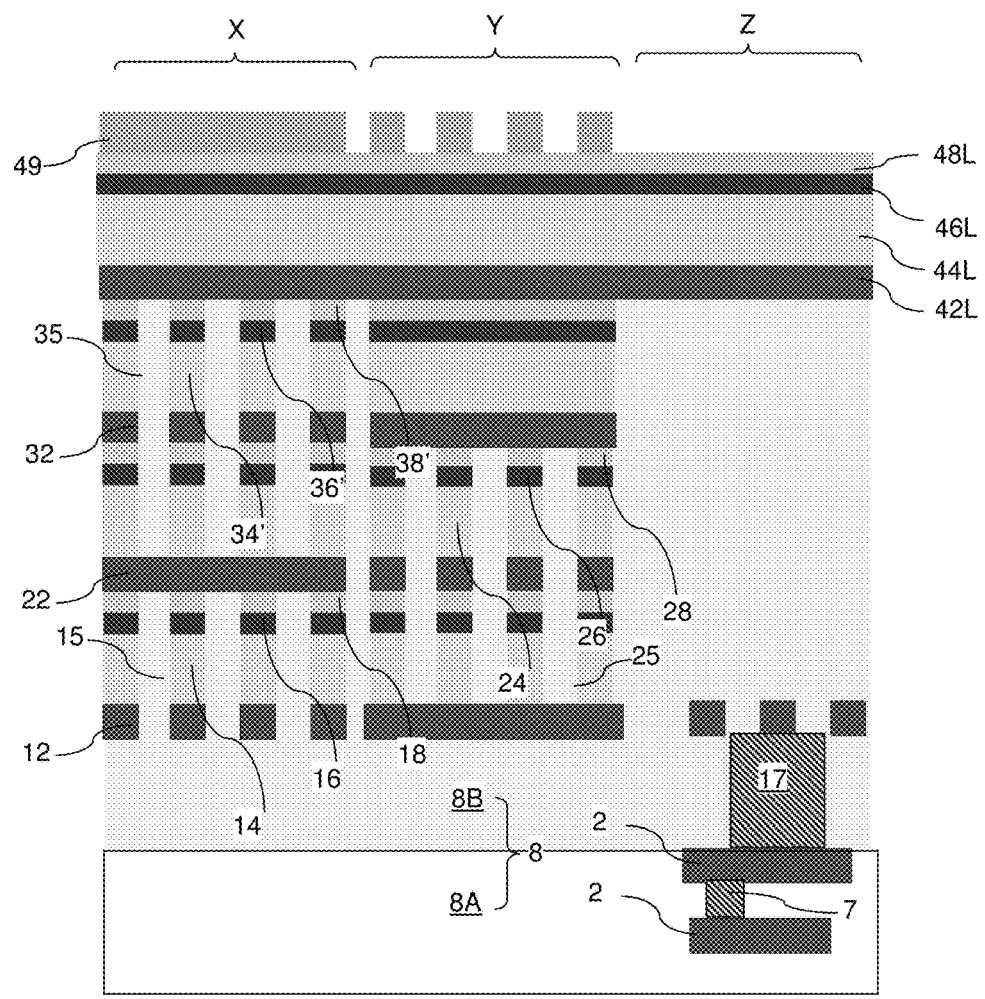
FIG. 7 is a vertical cross-sectional view of the exemplary structure after formation of third dielectric isolation structures, a fourth stack of layers including a fourth conductive material layer, a fourth phase change memory layer, and a fourth selector layer, and a fourth patterned hard mask layer according to an embodiment of the present disclosure.

Referring to FIG. 7, the stack of the third conductive material layer 32L, the third selector layer 34L, the third phase change memory layer 36L, and the third barrier material layer 38L, the second barrier rails 28', the second phase change memory rails 26', the second selector rails 24', and the second dielectric isolation structures 25 can be anisotropically etched employing the third hard mask layer 39 as an etch mask. Third trenches are formed through the stack of the third conductive material layer 32L, the third selector layer 34L, the third phase change memory layer 36L, and the third barrier material layer 38L, and through the second barrier rails 28', the second phase change memory rails 26', the second selector rails 24', and the second dielectric isolation structures 25 in areas that are not covered by the third hard mask layer 39.

Remaining portions of the stack of the third conductive material layer 32L, the third selector layer 34L, the third phase change memory layer 36L, and the third barrier material layer 38 L constitute third stacked rail structures (32, 34', 36', 38'). Each third stacked rail structure (32, 34', 36', 38') includes, from bottom to top, a third conductive rail 32 that is a patterned portion of the third conductive material layer 32L, a third selector rail 34' that is a patterned portion of the third selector layer 34L, a third phase change memory rail 36' that includes a patterned portion of the third phase change memory layer 36L, and a third barrier rail 38' that includes a patterned portion of the third barrier material layer 38. The third stacked rail structures (32, 34', 36', 38') laterally extend along the second horizontal direction hd2, and are laterally spaced among one another by the third trenches. The third conductive rails 32 may comprise third word lines which extend in the second horizontal direction hd2.

After patterning of the third barrier rails 38', the third phase change memory rails 36', the third selector rails 34', and the third conductive rails 32, the anisotropic etch process vertically extends the third trenches through the second barrier rails 28', the second phase change material rails 26', the second selector rails 24', and upper portions of the second dielectric isolation structures 25. Each stack of a second barrier rail 28', a second phase change memory rail 26', and a second selector rail 24' is divided into a respective row of second pillar structures (24, 26, 28).

Each second pillar structure (24, 26, 28) includes a second phase change memory element 26 that is a patterned portion of a second phase change memory rail 26' and a second selector element 24 that is a patterned portion of a second selector rail 24', and optionally includes a second barrier element 28 that is a patterned portion of a second barrier rail 28'. Each second selector element 24 can be in a series connection with a second phase change memory element 26 within the same second pillar structure (24, 26, 28). Each second phase change memory element 26 can be a pillar structure having a rectangular horizontal cross-sectional shape. Each second selector element 24 can be a pillar structure having a rectangular horizontal cross-sectional shape. Each second barrier element 28 can be a pillar structure having a rectangular horizontal cross-sectional shape. Each row of second pillar structures (24, 26, 28) can be laterally spaced among one another by the third trenches. The top surfaces of the second conductive rails 22 can function as an etch stop surface. Thus, the etch process that forms the third trenches can stop on the top surfaces of the second conductive rails 22, and therefore, the second conductive rails 22 are not divided by the third trenches.

Each second pillar structure (24, 26, 28) can have a respective rectangular horizontal cross-sectional shape. A two-dimensional array of second pillar structures (24, 26, 28) is formed between the second conductive rails 22 and the second conductive rails 22. The level of the second pillar structures (24, 26, 28) defines a second array level that includes a second two-dimensional array of memory elements, each including a respective set of a second phase change memory element 26 and a second selector element 24 in a series connection.

Each second dielectric isolation structures 25 can be etched through the levels of the second pillar structures (24, 26, 28), and not etched at the level of the second conductive rails 22. Each remaining portion of a second dielectric isolation structure 25 can include a laterally extending portion located at the level of the second conductive rails 22 and contacting at least one second conductive rail 22, and vertical portions protruding upward from the laterally extending portion and contacting a respective neighboring pair of second pillar structures (24, 26, 28). As such, each second dielectric isolation structure 25 can have a fork configuration with fingers that separate neighboring pairs of second pillar structures (24, 26, 28). The third trenches laterally separate neighboring pairs of forks, i.e., vertically protruding portions, of each second dielectric isolation structure 25.

A dielectric material such as silicon oxide can be conformally deposited in the third trenches. Excess portions of the dielectric material can be removed from above the third stacked rail structures (32, 34', 36', 38') by a planarization process such as chemical mechanical planarization or a recess etch. Remaining portions of the dielectric material in the third trenches constitute third dielectric isolation structures 35. The third dielectric isolation structures 35 can be rail structures that laterally extend along the second horizontal direction hd2. The third dielectric isolation structures 35 vertically extend from the level of the third stacked rail structures (32, 34', 36', 38') to top surfaces of the second conductive rails 22. Specifically, the third dielectric isolation structures 35 vertically extend from a horizontal plane including the topmost surfaces of the third stacked rail structures (32, 34', 36', 38') to top surfaces of the second conductive rails 22. In one embodiment, the third dielectric isolation structures 35 can have a homogeneous composition throughout, which is herein referred to as a third homogeneous composition. The set of second dielectric isolation structures 35 can vertically extend continuously through two vertically neighboring array levels. Each of the second pillar structures (24, 26, 28) contacts a top surface of a respective one of the second conductive rails 22 and a bottom surface of a respective one of the third conductive rails 32.

A fourth stack of layers (42L, 44L, 46L, 48L) is formed over the third stacked rail structures (32, 34', 36', 38') and the third dielectric isolation structures 35. The fourth stack of layers (42L, 44L, 46L, 48L) can include a fourth conductive material layer 42L, a fourth selector layer 44L, a fourth phase change memory layer 46L, and a fourth barrier material layer 48L. A fourth hard mask layer 49 can be formed thereupon.

The fourth conductive material layer 42L includes at least one conductive material layer, which can be any of the material that can be employed for the first, second, and third conductive material layers (12L, 22L, 32L), and can have the same thickness as the first, second, or third conductive material layer (12L, 22L, or 32L). The fourth selector layer 44L can include any of the materials that can be employed for the first, second, and third selector layers (14L, 24L, 34L), and can have the same thickness as the first, second, or third selector layer (14L, 24L, or 34L). The fourth phase change memory layer 46L can include any of the materials that can be employed for the first, second, and third phase change memory layers (16L, 26L, 36L), and can have the same thickness as the first, second, or third phase change memory layer (16L, 26L, or 36L). The fourth barrier material layer 48L can include any of the materials that can be employed for the first, second, or third barrier material layer (18L, 28L, 38L), and can have the same thickness as the first, second, or third barrier material layer (18L, 28L, or 38L).

The fourth hard mask layer 49 can be lithographically patterned to form a line and space pattern. The lines and spaces of the patterned fourth hard mask layer 49 can laterally extend along the first horizontal direction hd1, which is perpendicular to the lengthwise direction of the third stacked rail structures (32, 34', 36', 38'). The line and spacer pattern of the fourth hard mask layer 49 can have a periodic pattern with a periodicity along the second horizontal direction hd2.

Figure 8:
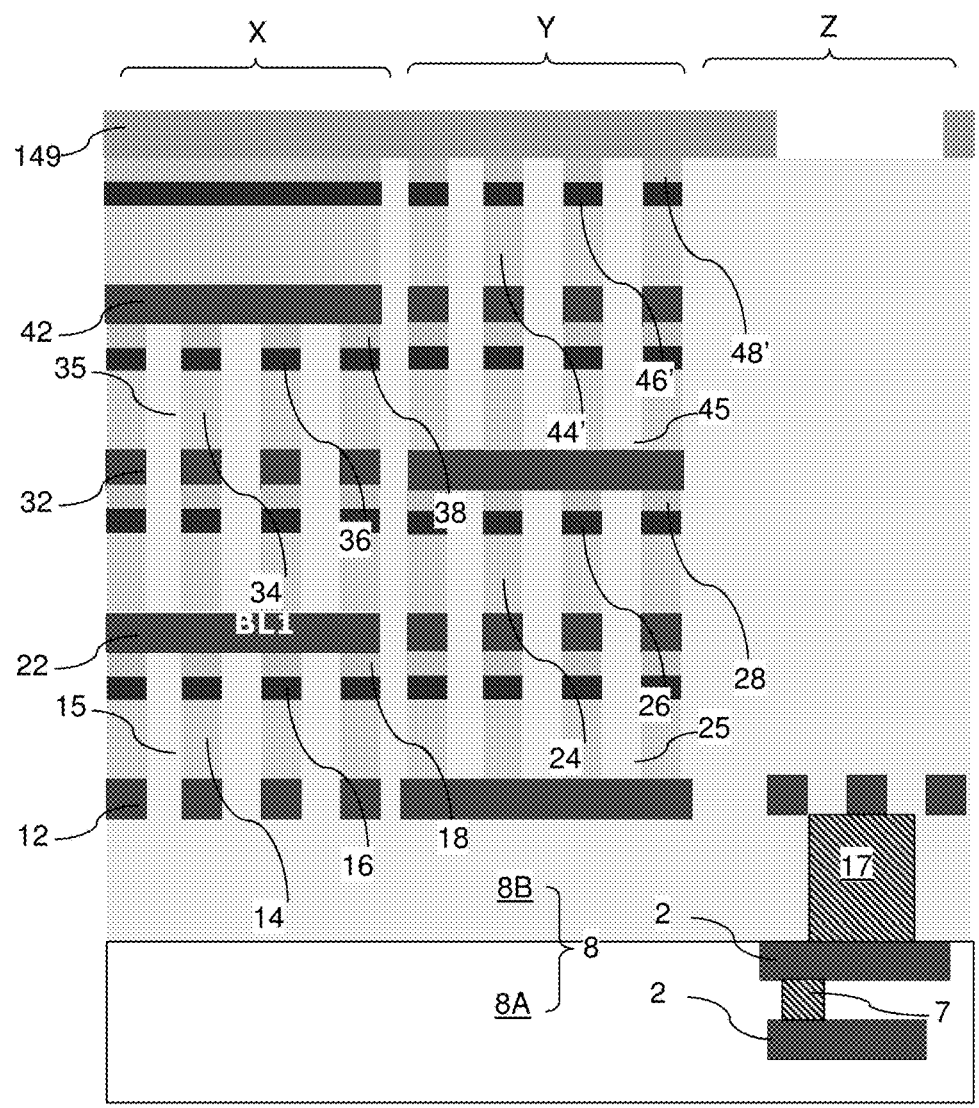
FIG. 8 is a vertical cross-sectional view of the exemplary structure after formation of fourth dielectric isolation structures and a peripheral pattern hard mask layer according to an embodiment of the present disclosure.

Referring to FIG. 8, the stack of the fourth conductive material layer 42L, the fourth selector layer 44L, the fourth phase change memory layer 46L, and the fourth barrier material layer 48L, the third barrier rails 38', the third phase change memory rails 36', the third selector rails 34', and the third dielectric isolation structures 35 can be anisotropically etched employing the fourth hard mask layer 49 as an etch mask. Fourth trenches are formed through the stack of the fourth conductive material layer 42L, the fourth selector layer 44L, the fourth phase change memory layer 46L, and the fourth barrier material layer 48L, and through the third barrier rails 38', the third phase change memory rails 36', the third selector rails 34', and the third dielectric isolation structures 35 in areas that are not covered by the fourth hard mask layer 49.

Remaining portions of the stack of the fourth conductive material layer 42L, the fourth selector layer 44L, the fourth phase change memory layer 46L, and the fourth barrier material layer 48 L constitute fourth stacked rail structures (42, 44', 46', 48'). Each fourth stacked rail structure (42, 44', 46', 48') includes, from bottom to top, a fourth conductive rail 42 that is a patterned portion of the fourth conductive material layer 42L, a fourth selector rail 44' that is a patterned portion of the fourth selector layer 44L, a fourth phase change memory rail 46' that includes a patterned portion of the fourth phase change memory layer 46L, and a fourth barrier rail 48' that includes a patterned portion of the fourth barrier material layer 48. The fourth stacked rail structures (42, 44', 46', 48') laterally extend along the first horizontal direction hd1, and are laterally spaced among one another by the fourth trenches in the second horizontal direction hd2. The fourth conductive rails 42 may comprise second bit lines which extend in the first horizontal direction hd1.

After patterning of the fourth barrier rails 48', the fourth phase change memory rails 46', the fourth selector rails 44', and the fourth conductive rails 42, the anisotropic etch process vertically extends the fourth trenches through the third barrier rails 38', the third phase change material rails 36', the third selector rails 34', and upper portions of the third dielectric isolation structures 35. Each stack of a third barrier rail 38', a third phase change memory rail 36', and a third selector rail 34' is divided into a respective row of third pillar structures (34, 36, 38).

Each third pillar structure (34, 36, 38) includes a third phase change memory element 36 that is a patterned portion of a third phase change memory rail 36' and a third selector element 34 that is a patterned portion of a third selector rail 34', and optionally includes a third barrier element 38 that is a patterned portion of a third barrier rail 38'. Each third selector element 34 can be in a series connection with a third phase change memory element 36 within the same third pillar structure (34, 36, 38). Each third phase change memory element 36 can be a pillar structure having a rectangular horizontal cross-sectional shape. Each third selector element 34 can be a pillar structure having a rectangular horizontal cross-sectional shape. Each third barrier element 38 can be a pillar structure having a rectangular horizontal cross-sectional shape. Each row of third pillar structures (34, 36, 38) can be laterally spaced among one another by the fourth trenches. The top surfaces of the third conductive rails 32 can function as an etch stop surface. Thus, the etch process that forms the fourth trenches can stop on the top surfaces of the third conductive rails 32, and therefore, the third conductive rails 32 are not divided by the fourth trenches.

Each third pillar structure (34, 36, 38) can have a respective rectangular horizontal cross-sectional shape. A two-dimensional array of third pillar structures (34, 36, 38) is formed between the third conductive rails 32 and the third conductive rails 32. The level of the third pillar structures (34, 36, 38) defines a third array level that includes a third two-dimensional array of memory elements, each including a respective set of a third phase change memory element 36 and a third selector element 34 in a series connection.

Each third dielectric isolation structures 35 can be etched through the levels of the third pillar structures (34, 36, 38), and not etched at the level of the third conductive rails 32. Each remaining portion of a third dielectric isolation structure 35 can include a laterally extending portion located at the level of the third conductive rails 32 and contacting at least one third conductive rail 32, and vertical portions protruding upward from the laterally extending portion and contacting a respective neighboring pair of third pillar structures (34, 36, 38). As such, each third dielectric isolation structure 35 can have a fork configuration with fingers that separate neighboring pairs of third pillar structures (34, 36, 38). The fourth trenches laterally separate neighboring pairs of forks, i.e., vertically protruding portions, of each third dielectric isolation structure 35.

A dielectric material such as silicon oxide can be conformally deposited in the fourth trenches. Excess portions of the dielectric material can be removed from above the fourth stacked rail structures (42, 44', 46', 48') by a planarization process such as chemical mechanical planarization or a recess etch. Remaining portions of the dielectric material in the fourth trenches constitute fourth dielectric isolation structures 45. The fourth dielectric isolation structures 45 can be rail structures that laterally extend along the first horizontal direction hd1. The fourth dielectric isolation structures 45 vertically extend from the level of the fourth stacked rail structures (42, 44', 46', 48') to top surfaces of the third conductive rails 32. Specifically, the fourth dielectric isolation structures 45 vertically extend from a horizontal plane including the topmost surfaces of the fourth stacked rail structures (42, 44', 46', 48') to top surfaces of the third conductive rails 32. In one embodiment, the fourth dielectric isolation structures 45 can have a homogeneous composition throughout, which is herein referred to as a fourth homogeneous composition. The set of third dielectric isolation structures 45 can vertically extend continuously through two vertically neighboring array levels. Each of the third pillar structures (34, 36, 38) contacts a top surface of a respective one of the third conductive rails 32 and a bottom surface of a respective one of the fourth conductive rails 42.

A first peripheral patterning hard mask layer 149 can be applied over the fourth stacked rail structures (42, 44', 46', 48') and the fourth dielectric isolation structures 45, and can be lithographically patterned to form openings within the peripheral region 300.

Figure 9:
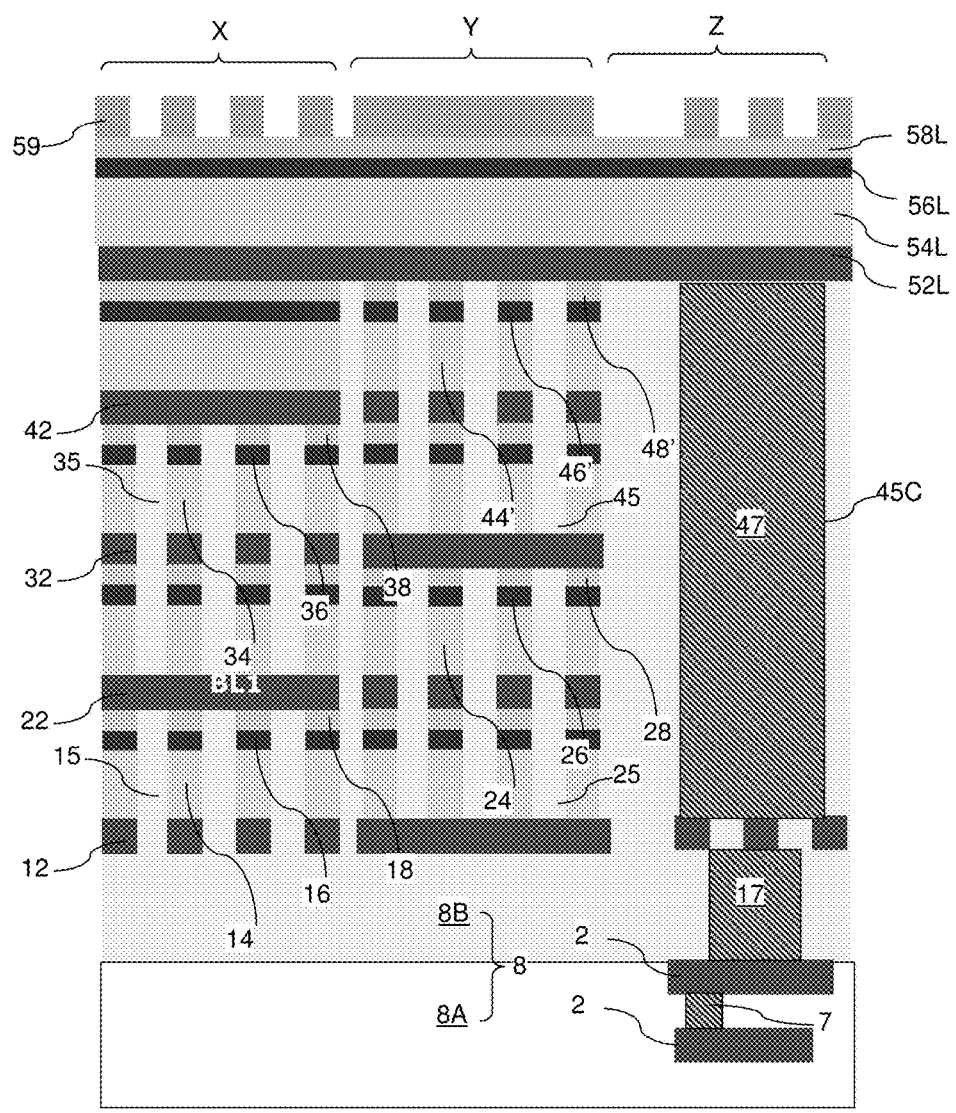
FIG. 9 is a vertical cross-sectional view of the exemplary structure after formation of first peripheral contact via structures, a fifth stack of layers including a fifth conductive material layer, a fifth phase change memory layer, and a fifth selector layer, and a fifth patterned hard mask layer according to an embodiment of the present disclosure.

Referring to FIG. 9, at least one peripheral via cavity 45C is formed by etching through dielectric material portions located at the first, second, third, and fourth array levels. The dielectric material in the peripheral region 300 can be the same as the dielectric materials of the first, second, third, and fourth dielectric isolation structures (15, 25, 35, 45). A conductive material is deposited in each of the at least one peripheral via cavity. Excess portions of the conductive material can be removed from above the top surfaces of the fourth stacked rail structures (42, 44', 46', 48') by a recess etch of chemical mechanical planarization. Each remaining portion of the conductive material constitutes a first peripheral contact via structure 47.

A fifth stack of layers (52L, 54L, 56L, 58L) is formed over the fourth stacked rail structures (42, 44', 46', 48') and the fourth dielectric isolation structures 45. The fifth stack of layers (52L, 54L, 56L, 58L) can include a fifth conductive material layer 52L, a fifth selector layer 54L, a fifth phase change memory layer 56L, and a fifth barrier material layer 58L. A fifth hard mask layer 59 can be formed thereupon.

The fifth conductive material layer 52L includes at least one conductive material layer, which can be any of the material that can be employed for the first, second, third, and fourth conductive material layers (12L, 22L, 32L, 42L), and can have the same thickness as the first, second, third, or fourth conductive material layer (12L, 22L, 32L, or 42L). The fifth selector layer 54L can include any of the materials that can be employed for the first, second, third, and fourth selector layers (14L, 24L, 34L, 44L), and can have the same thickness as the first, second, third, or fourth selector layer (14L, 24L, 34L, or 44L). The fifth phase change memory layer 56L can include any of the materials that can be employed for the first, second, third, and fourth phase change memory layers (16L, 26L, 36L, 46L), and can have the same thickness as the first, second, third, or fourth phase change memory layer (16L, 26L, 36L, or 46L). The fifth barrier material layer 58L can include any of the materials that can be employed for the first, second, third, or fourth barrier material layer (18L, 28L, 38L, 48L), and can have the same thickness as the first, second, third, or fourth barrier material layer (18L, 28L, 38L, or 48L).

The fifth hard mask layer 59 can be lithographically patterned to form a line and space pattern. The lines and spaces of the patterned fifth hard mask layer 59 can laterally extend along the second horizontal direction hd2, which is perpendicular to the lengthwise direction of the fourth stacked rail structures (42, 44', 46', 48'). The line and spacer pattern of the fifth hard mask layer 59 can have a periodic pattern with a periodicity along the first horizontal direction hd1.

Figure 10:
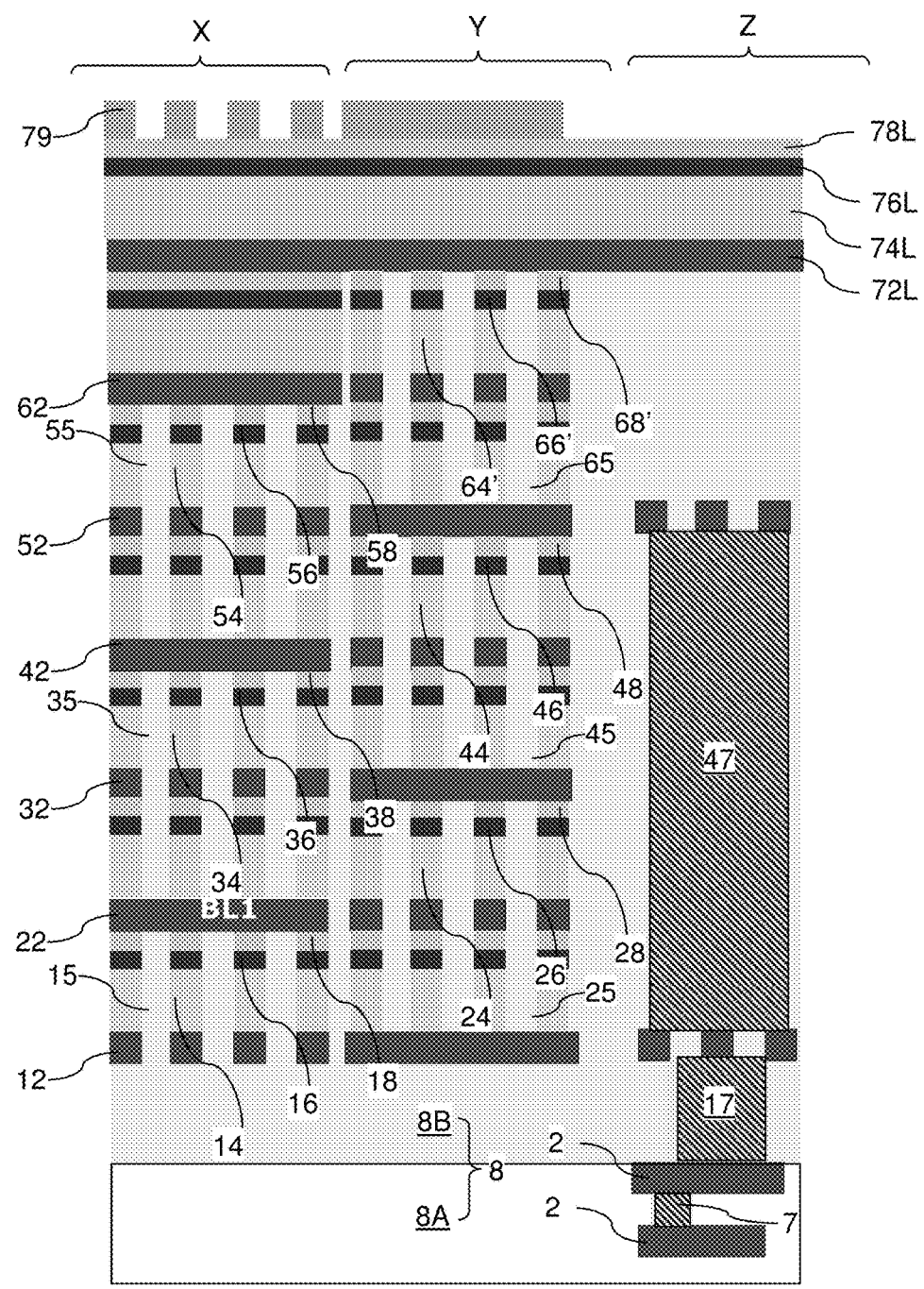
FIG. 10 is a vertical cross-sectional view of the exemplary structure after formation of fifth stacked rail structures and fifth dielectric isolation structures, sixth stacked rail structures and sixth dielectric isolation structures, and a seventh patterned hard mask layer according to an embodiment of the present disclosure.

Referring to FIG. 10, processing steps of FIGS. 7, 8, and 9 can be performed with appropriate level changes and with optional omission of processing steps for formation, patterning, and removal of the first peripheral patterning hard mask layer 149 and for formation of the first peripheral contact via structure 47. An array of fourth pillar structures (44, 46, 48) is formed at a fourth array level. Fifth conductive rails 52 are formed over the array of fourth pillar structures (44, 46, 48). The fifth conductive rails 52 may comprise third word lines which extend in the second horizontal direction hd2. An array of fifth pillar structures (54, 56, 58) is formed at a fifth array level. Fifth dielectric isolation structures 55 vertically extending from the horizontal plane including the top surfaces of the fifth pillar structures (54, 56, 58) to top surfaces of the fourth conductive rails 42 are formed through the fifth array level and the fourth array level. Sixth stacked rail structures (62, 64', 66', 68') including the sixth conductive rails 62 are formed over the array of fifth pillar structures (54, 56, 58). Sixth dielectric isolation structures 65 vertically extending from the horizontal plane including the top surfaces of the sixth stacked rail structures (62, 64', 66', 68') to top surfaces of the fifth conductive rails 52 are formed through the sixth array level and the fifth array level. The sixth conductive rails 62 may comprise third bit lines which extend in the first horizontal direction hd1.

A seventh stack of layers (72L, 74L, 76L, 78L) is formed over the sixth stacked rail structures (62, 66', 66', 68') and the sixth dielectric isolation structures 65. The seventh stack of layers (72L, 74L, 76L, 78L) can include a seventh conductive material layer 72L, a seventh selector layer 74L, a seventh phase change memory layer 76L, and a seventh barrier material layer 78L. A seventh hard mask layer 79 can be formed thereupon.

The seventh conductive material layer 72L includes at least one conductive material layer, which can be any of the material that can be employed for the first through sixth conductive material layers (12L, 22L, 32L, 42L, 52L, 62L), and can have the same thickness as any of the first through sixth conductive material layer (12L, 22L, 32L, 42L, 52L, 62L). The seventh selector layer 74L can include any of the materials that can be employed for the first through sixth selector layers (14L, 24L, 34L, 44L, 54L, 64L), and can have the same thickness as any of the first through sixth selector layers (14L, 24L, 34L, 44L, 54L, 64L). The seventh phase change memory layer 76L can include any of the materials that can be employed for the first through sixth phase change memory layers (16L, 26L, 36L, 46L, 56L, 66L), and can have the same thickness as any of the first through sixth phase change memory layers (16L, 26L, 36L, 46L, 56L, 66L). The seventh barrier material layer 78L can include any of the materials that can be employed for the first through sixth barrier material layer (18L, 28L, 38L, 48L, 58L, 68L), and can have the same thickness as any of the first through sixth barrier material layer (18L, 28L, 38L, 48L, 58L, 68L).

The seventh hard mask layer 79 can be lithographically patterned to form a line and space pattern. The lines and spaces of the patterned seventh hard mask layer 79 can laterally extend along the second horizontal direction hd2, which is perpendicular to the lengthwise direction of the sixth stacked rail structures (62, 66', 66', 68'). The line and spacer pattern of the seventh hard mask layer 79 can have a periodic pattern with a periodicity along the first horizontal direction hd1.

Figure 11:
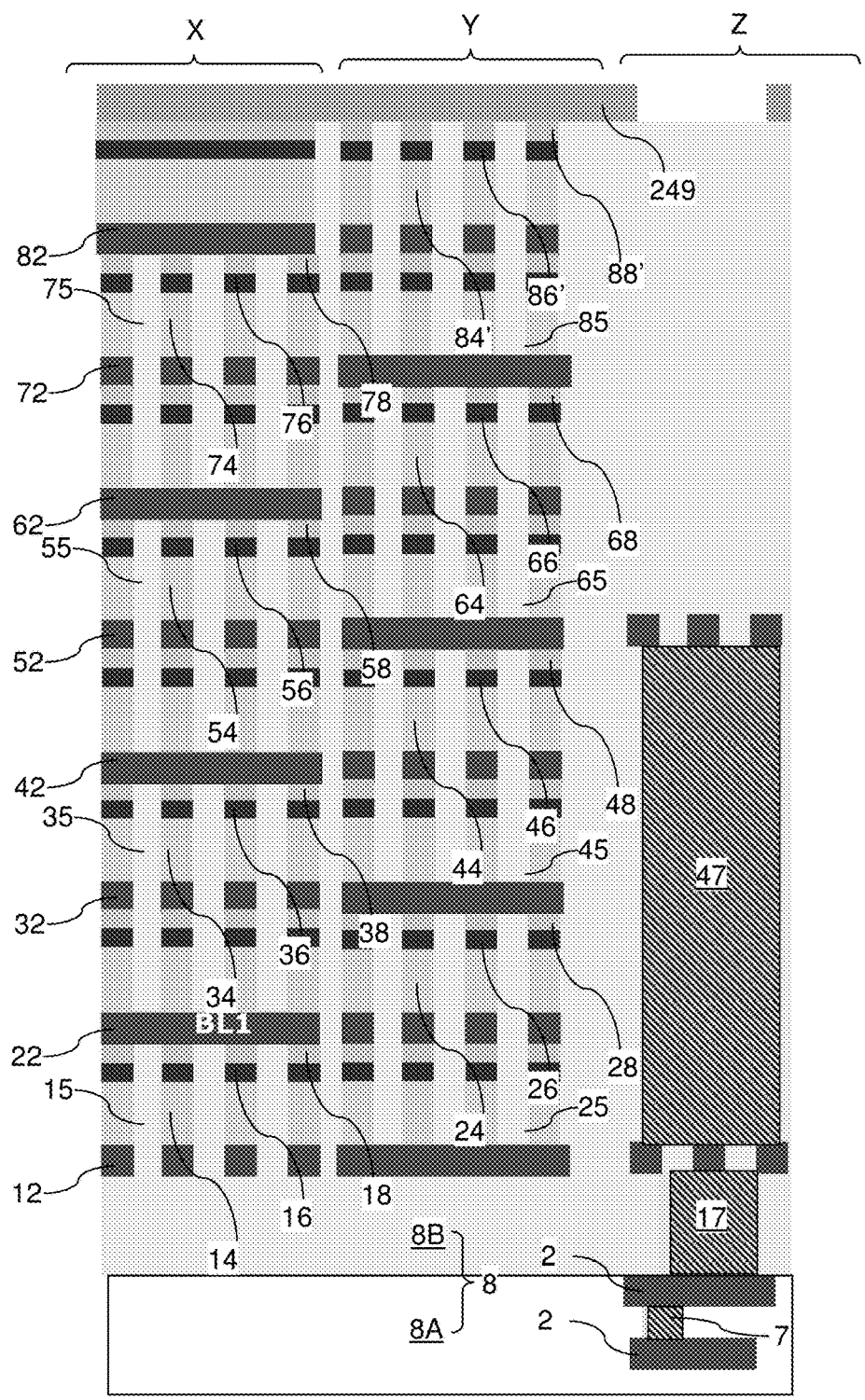
FIG. 11 is a vertical cross-sectional view of the exemplary structure after formation of seventh stacked rail structures and seventh dielectric isolation structures, and an eighth patterned hard mask layer according to an embodiment of the present disclosure.

Referring to FIG. 11, the processing steps of FIGS. 7 and 8 can be performed with appropriate level changes to form an array of sixth pillar structures (64, 66, 68) at a sixth array level. Seventh conductive rails 72 are formed over the array of sixth pillar structures (64, 66, 68). The seventh conductive rails 72 may comprise fourth word lines which extend in the second horizontal direction hd2. An array of seventh pillar structures (74, 76, 78) is formed at a seventh array level. Seventh dielectric isolation structures 75 vertically extending from the horizontal plane including the top surfaces of the seventh pillar structures (74, 76, 78) to top surfaces of the sixth conductive rails 62 are formed through the seventh array level and the sixth array level.

Eighth stacked rail structures (82, 84', 86', 88') including the eighth conductive rails 82 are formed over the array of seventh pillar structures (74, 76, 78). The eighth conductive rails 82 may comprise fourth bit lines which extend in the first horizontal direction hd1. Eighth dielectric isolation structures 85 vertically extending from the horizontal plane including the top surfaces of the eighth stacked rail structures (82, 84', 86', 88') to top surfaces of the seventh conductive rails 72 are formed through the eighth array level and the seventh array level.

A second peripheral patterning hard mask layer 249 can be applied over the eighth stacked rail structures (82, 84', 86', 88') and the eighth dielectric isolation structures 85, and can be lithographically patterned to form openings within the peripheral region 300.

Figure 12:
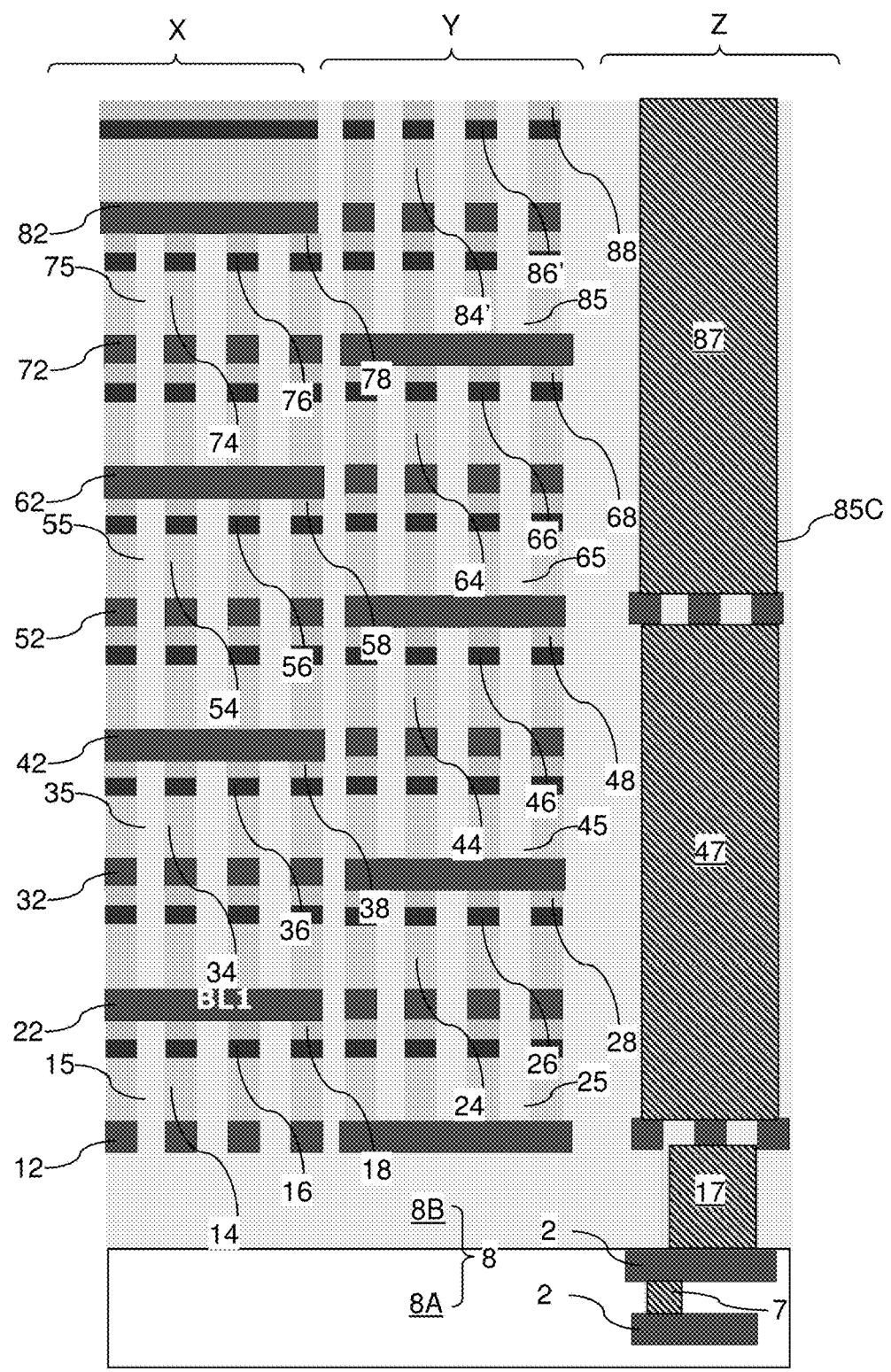
FIG. 12 is a vertical cross-sectional view of the exemplary structure after formation of eighth stacked rail structures and eighth dielectric isolation structures, and second peripheral contact via structures according to an embodiment of the present disclosure.

Referring to FIG. 12, at least one peripheral via cavity 85C is formed by etching through dielectric material portions located at the fifth through eighth array levels. The dielectric material in the peripheral region 300 can be the same as the dielectric materials of the fifth through eighth dielectric isolation structures (55, 65, 75, 85). A conductive material is deposited in each of the at least one peripheral via cavity 85C. Excess portions of the conductive material can be removed from above the top surfaces of the eighth stacked rail structures (82, 84', 86', 88') by a recess etch of chemical mechanical planarization. Each remaining portion of the conductive material constitutes a second peripheral contact via structure 87.

Subsequently, additional array levels may be formed by repeating the processing steps of FIGS. 9-12. After formation of a topmost stacked rail structures and dielectric isolation structures that extend between the topmost array level and the array level immediately therebelow, a topmost conductive material layer can be formed, and topmost line trenches can be formed to divide the topmost conductive material layer into topmost conductive rails and to divide the underlying barrier rails, phase change memory rails, and selector rails into an array of topmost pillar structures. Topmost dielectric isolation structures can be subsequently formed in the topmost line trenches.

Generally, the processing steps described above can be performed to form a phase change memory device comprising a vertical stack of multiple two-dimensional arrays of pillar structures {(14, 16, 18), (24, 26, 28), etc.}. Each of the multiple two-dimensional arrays of pillar structures {(14, 16, 18), (24, 26, 28), etc.} is located within a respective array level. Each two-dimensional array among the multiple two-dimensional arrays of pillar structures {(14, 16, 18), (24, 26, 28), etc.} is contacted by a respective overlying one-dimensional array of conductive rails (22, 32, etc.) laterally extending along a first horizontal direction and a respective underlying one-dimensional array of conductive rails (12, 22, etc.) laterally extending along a second horizontal direction which is non-parallel to the first horizontal direction (e.g., perpendicular to the first horizontal direction). Each pillar structure {(14, 16, 18), (24, 26, 28), etc.} within the multiple two-dimensional arrays of pillar structures {(14, 16, 18), (24, 26, 28), etc.} comprises a phase change memory element (16, 26, etc.) and a selector element (14, 24, etc.) in a series connection with the phase change memory element (16, 26, etc.). A first set of dielectric isolation structures (25, 35, etc.) having a first homogeneous composition vertically extends continuously through two vertically neighboring array levels.

Details of the processing steps between FIG. 2 and FIG. 6 are described below with reference to an additional set of drawings.

Figure 13A:
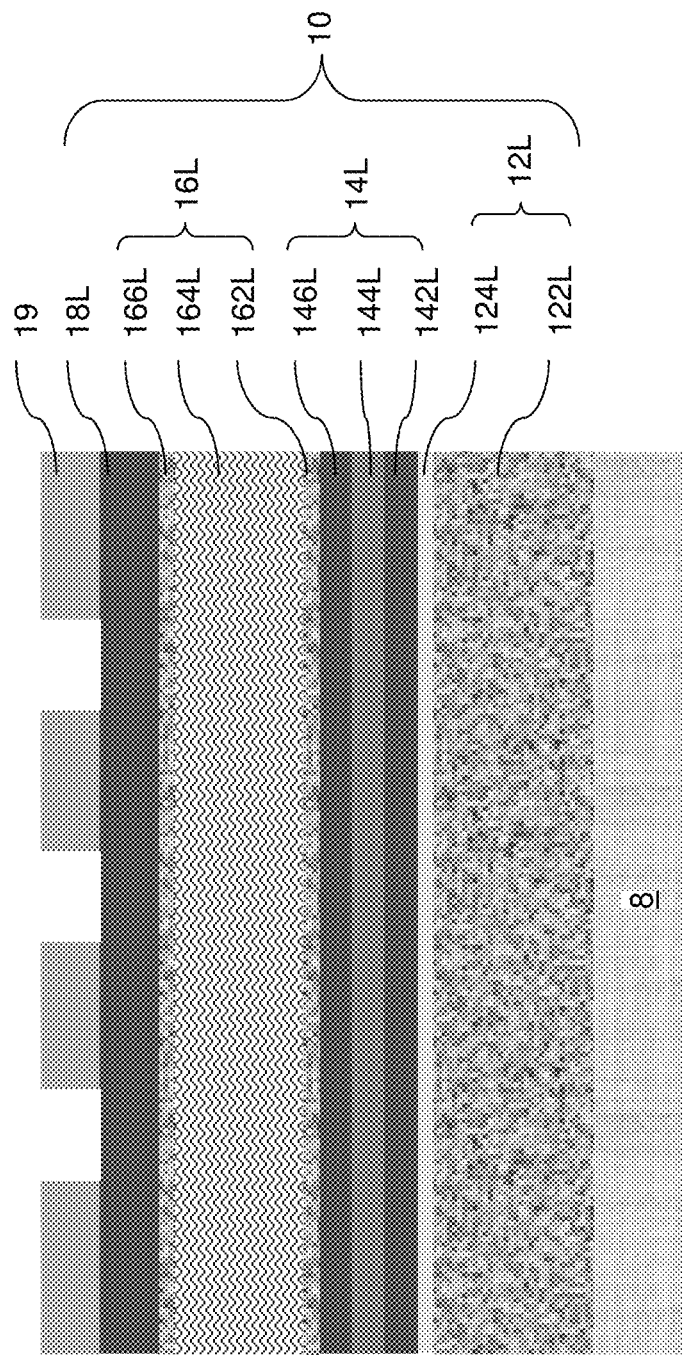
FIG. 13A is another vertical cross-sectional view of the exemplary structure of FIG. 2 illustrating components of various elements in FIG. 2.

Referring to FIGS. 13A and 13B, a first stack of layers 10 is formed over the substrate 8. The first stack of layers 10 can include the first conductive material layer 12L, the first selector layer 14L, the first phase change memory layer 16L, a first barrier material layer 18L, and a first hard mask layer 19.

The first conductive material layer 12L includes at least one conductive material layer, which can be at least one metallic material layer. For example, the first conductive material layer 12L can include a layer stack, from bottom to top, of a first metal layer 122L (such as a tungsten layer) and a first metal nitride layer 124L (such as a tungsten nitride layer or a titanium nitride layer). The thickness of the first conductive material layer 12L can be in a range from 20 nm to 100 nm, although lesser and greater thicknesses can also be employed.

The first selector layer 14L includes a non-Ohmic material that provides electrical connection of electrical isolation depending on the magnitude and/or the polarity of an externally applied voltage bias thereacross. In one embodiment, the first selector layer 14L includes an ovonic threshold switch material layer 144L. Further, the first selector layer 14L can include an optional first upper barrier material layer 146L overlying the ovonic threshold switch material layer 144L and an optional first lower barrier material layer 142L underlying the ovonic threshold switch material layer 144L. The optional first upper and/or first lower barrier material layers (146L, 142L) include a material that suppresses diffusion of the material of the ovonic threshold switch material layer 144L. For example, the optional first upper and/or first lower barrier material layers (146L, 142L) can include amorphous carbon or diamond-like carbon (DLC). In one embodiment, the optional first upper barrier material layer 146L can include an upper amorphous carbon layer that contacts a top surface of the ovonic threshold switch material layer 144L and the optional first lower barrier material layer 142L can include a lower amorphous carbon layer that contacts a bottom surface of the ovonic threshold switch material layer 144L. Alternatively or additionally, the first selector layer 14L may include alternative non-Ohmic material layer such as a p-n or p-i-n junction diode layer. In this case, the first selector layer 14L becomes conductive only under electrical bias condition of one polarity, and becomes electrically non-conductive under electrical bias condition of the opposite polarity.

The first phase change memory layer 16L includes at least a layer of a phase change memory material, i.e., a phase change memory material layer 164L. The phase change memory layer 16L may include an optional first upper conducive liner 166L and/or an optional first lower conductive liner 162L. The optional first upper and/or first lower conductive liners (166L, 164L), if present, includes a thin layer of metal or metal nitride. For example, the optional first upper and/or first lower conductive liners (166L, 162L) can be a respective metal layer such as a tungsten layer or a metal compound layer such as a titanium nitride layer. The thickness of each of the optional first upper and first lower metal liners (166L, 164L) can be in a range from 2 nm to 10 nm, although lesser and greater thicknesses can also be employed.

The first barrier material layer 18L includes a barrier material such as amorphous carbon. The first barrier material layer 18L provides effective encapsulation of the underlying phase change memory material. The thickness of the first barrier material layer 18L can be in a range from 0.5 nm to 10 nm, such as from 1 nm to 5 nm, although lesser and grater thicknesses can also be employed.

The first hard mask layer 19 can be lithographically patterned to form a line and space pattern. The lines and spaces of the patterned first hard mask layer 19 can laterally extend along the second horizontal direction hd2. The line and spacer pattern of the first hard mask layer 19 can have a periodic pattern with a periodicity along the first horizontal direction hd1.

Referring to FIG. 14, another vertical cross-sectional view of the exemplary structure is illustrated at the processing step of FIG. 3. First trenches are formed through the first stack of layers (12L, 14L, 16L, 18L) to form the first stacked rail structures (12, 14', 16', 18'). Various first insulating spacer sublayers and a first dielectric isolation layer can be deposited in the first trenches. Each remaining vertical portion of the first insulating spacer layers comprises a first insulating spacer 13. Each remaining vertical portion of the first dielectric isolation layer within the first trenches constitutes a first dielectric isolation structure 15. As discussed above, the first dielectric isolation structures 15 can be rail structures that laterally extend along the second horizontal direction hd2. In one embodiment, the first dielectric isolation structures 15 can have a homogeneous composition throughout, which is herein referred to as a first homogeneous composition.

In one embodiment, each first insulating spacer 13 can include a contiguous set of dielectric liners such as a set of a first outer insulating liner 132, a first dielectric oxide insulating liner 134, a first intermediate insulating liner 136, and a first inner insulating liner 138. It is understood that each of a first outer insulating liner 132, a first dielectric oxide insulating liner 134, a first intermediate insulating liner 136, and a first inner insulating liner 138 within a first insulating spacer 13 is optional. Thus, each first insulating spacer 13 may include one, two, three, or four insulating liners (132, 134, 136, 138). Further, in some embodiments, the first insulating spacer 13 may be omitted.

Figure 15A:
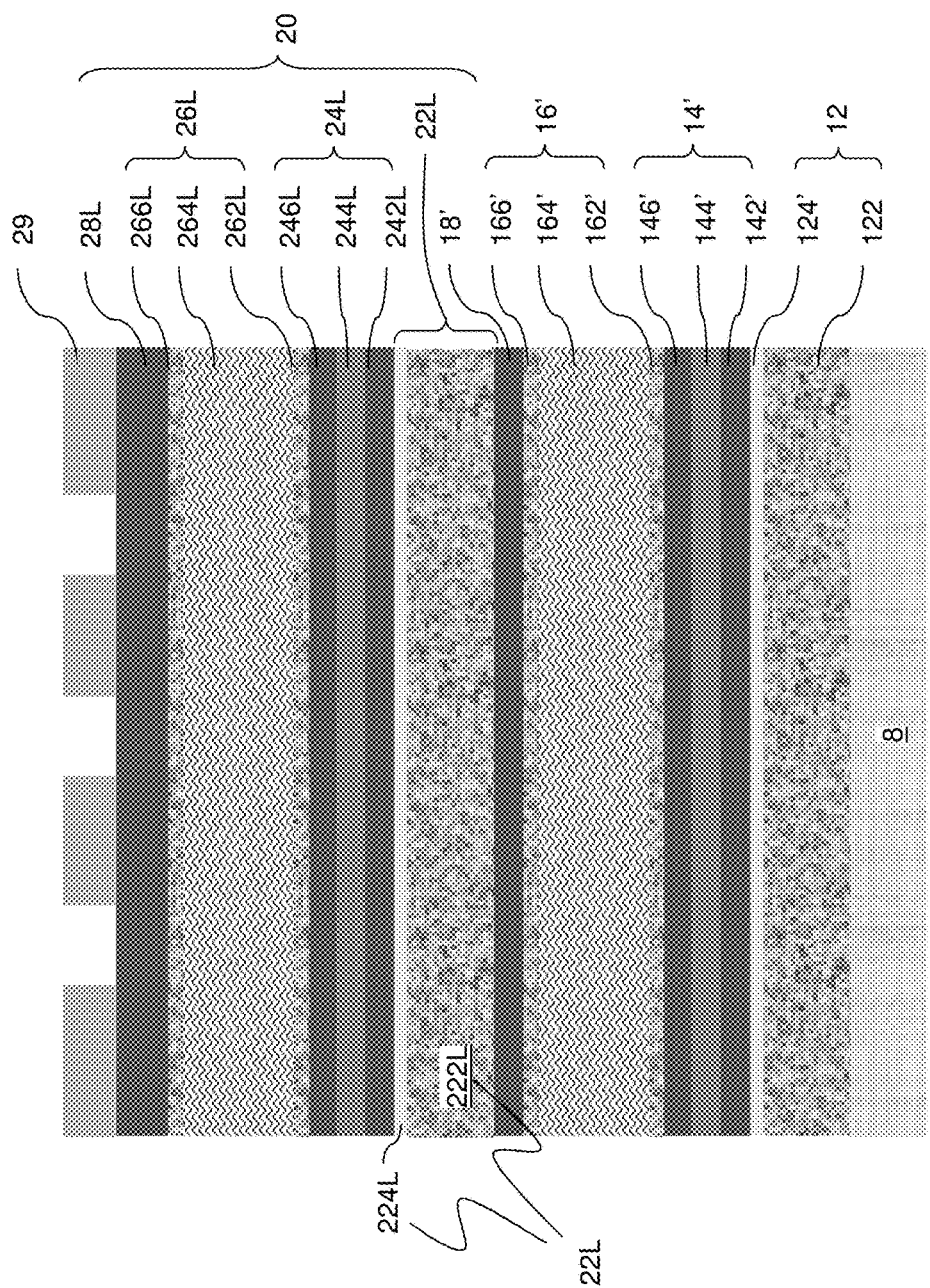
FIG. 15A is another vertical cross-sectional view of the exemplary structure at the processing step of FIG. 4.
Figure 16A:
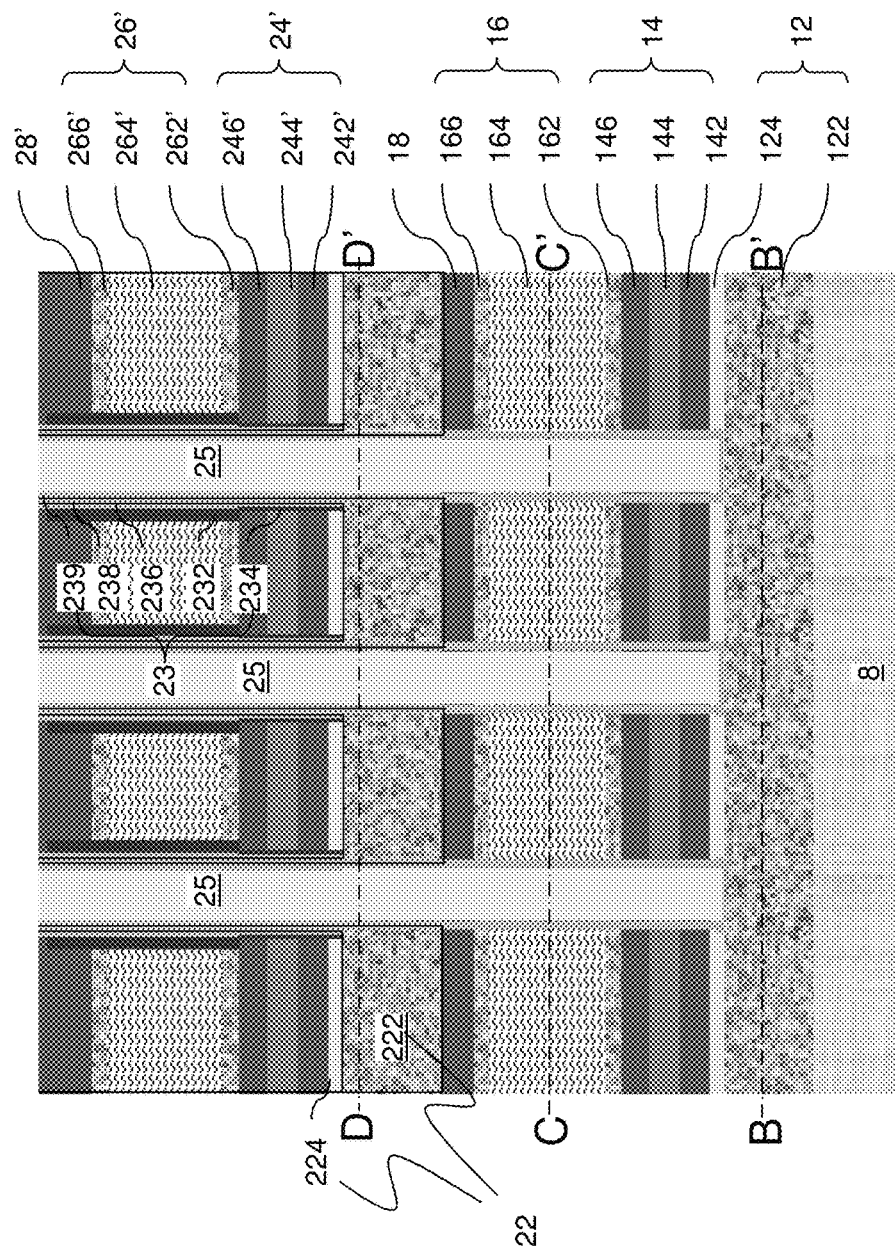
FIG. 16A is a vertical cross-sectional view of the exemplary structure after deposition of second dielectric isolation structures according to an embodiment of the present disclosure.
Figure 16C:
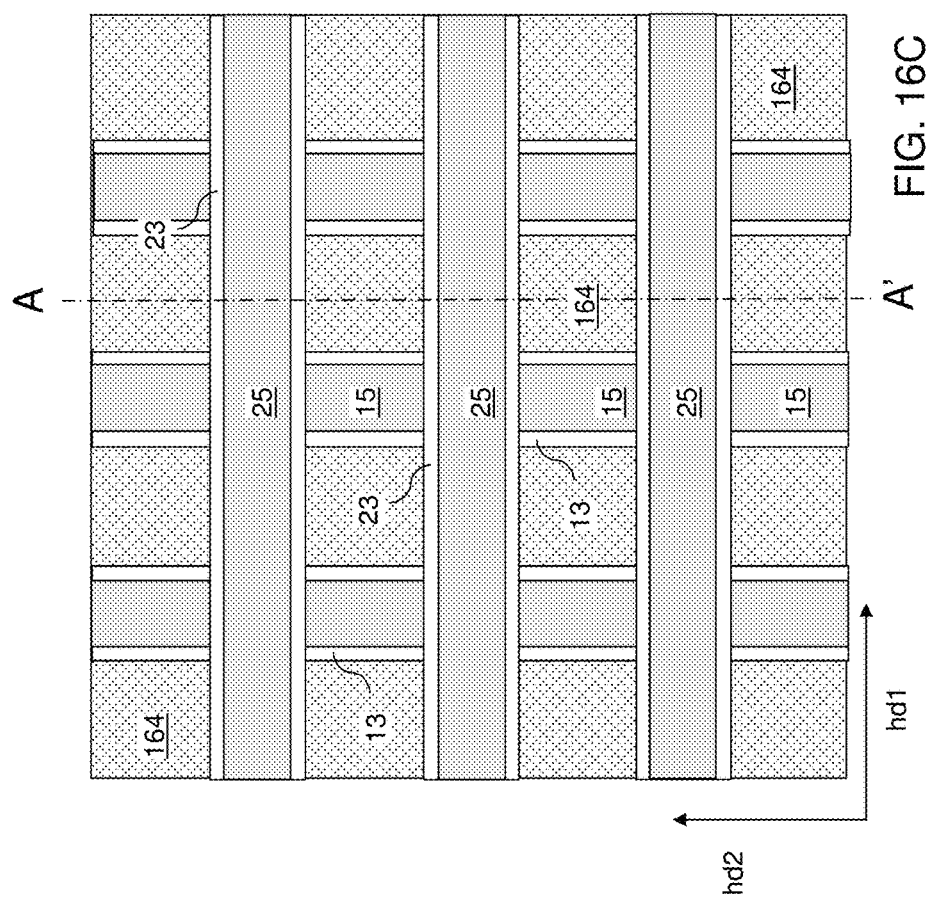
FIG. 16C is a horizontal cross-sectional view of the exemplary structure along the horizontal plane C-C' of FIG. 16A. Plane A-A' corresponds to the view of FIG. 16A.

Referring to FIGS. 15A and 15B, a second stack of layers 20 is formed over the first stacked rail structures (12, 14', 16', 18') and the first dielectric isolation structures 15. The second stack of layers 20 can include a second conductive material layer 22L, a second selector layer 24L, a second phase change memory layer 26L, and a second barrier material layer 28L. A second hard mask layer 29 can be formed thereupon.

The second conductive material layer 22L includes at least one conductive material layer, which can be at least one metallic material layer. For example, the second conductive material layer 22L can include a layer stack, from bottom to top, of a second metal layer 222L (such as a tungsten layer) and a second metal nitride layer 224L (such as a tungsten nitride layer or a titanium nitride layer). The thickness of the second conductive material layer 22L can be in a range from 20 nm to 200 nm, although lesser and greater thicknesses can also be employed.

The second selector layer 24L includes a non-Ohmic material that provides electrical connection of electrical isolation depending on the magnitude and/or the polarity of an externally applied voltage bias thereacross. In one embodiment, the second selector layer 24L includes an ovonic threshold switch material layer 244L. Further, the second selector layer 24L can include an optional second upper barrier material layer 246L overlying the ovonic threshold switch material layer 244L and an optional second lower barrier material layer 242L underlying the ovonic threshold switch material layer 244L. The optional second upper and/or second lower barrier material layers (246L, 244L) include a material that suppresses diffusion of the material of the ovonic threshold switch material layer 244L. For example, the optional second upper and/or second lower barrier material layers (246L, 242L) can include amorphous carbon or diamond-like carbon (DLC). Alternatively or additionally, the second selector layer 24L may include alternative non-Ohmic material layer such as a p-n junction diode layer. In this case, the second selector layer 24L becomes conductive only under electrical bias condition of one polarity, and becomes electrically non-conductive under electrical bias condition of the opposite polarity.

The second phase change memory layer 26L includes at least a layer of a phase change memory material, i.e., a phase change memory material layer 264L. The phase change memory layer 26L may include an optional second upper conducive liner 266L and/or an optional second lower conductive liner 262L. The optional second upper and/or second lower conductive liners (266L, 264L), if present, includes a thin layer of metal. For example, the optional second upper and/or second lower conductive liners (266L, 262L) can be a respective metal layer such as a tungsten layer or a metal compound layer such as a titanium nitride layer. The thickness of each of the optional second upper and second lower metal liners (266L, 264L) can be in a range from 2 nm to 20 nm, although lesser and greater thicknesses can also be employed.

The second barrier material layer 28L includes a barrier material such as amorphous carbon. The second barrier material layer 28L provides effective encapsulation of the underlying phase change memory material. The thickness of the second barrier material layer 28L can be in a range from 0.5 nm to 20 nm, such as from 2 nm to 5 nm, although lesser and grater thicknesses can also be employed.

The second hard mask layer 29 can be lithographically patterned to form a line and space pattern. The lines and spaces of the patterned second hard mask layer 29 can laterally extend along the first horizontal direction hd1. The line and spacer pattern of the second hard mask layer 29 can have a periodic pattern with a periodicity along the second horizontal direction hd2.

Referring to FIGS. 16A-16D, the stack of the second phase change memory layer 26L, and the second barrier material layer 28L can be anisotropically etched employing the second hard mask layer 29 as an etch mask. Second trenches are formed through the stack of the second phase change memory layer 26L and the second barrier material layer 28L in areas that are not covered by the second hard mask layer 29. Second barrier rails 28' and second phase change memory rails 26' are formed in areas masked by the patterned second hard mask layer 29. Each second phase change memory rail 26' includes a patterned portion of the second phase change memory layer 26L, and each second barrier rail 28' includes a patterned portion of the second barrier material layer 28. In one embodiment, each second phase change memory rail 26' can include a phase change memory material rail 264' that is a patterned portion of the phase change memory material layer 264L, an optional second upper conductive liner rail 266' that is a patterned portion of the optional second upper conductive liner 266L, and an optional second lower conductive liner rail 262' that is a patterned portion of the optional second lower conductive liner 262L. The second stacked rail structures (22, 24', 26', 28') laterally extend along the first horizontal direction hd1, are laterally spaced among one another by the second trenches, and are located over the substrate 8.

The second selector layer 24 is divided into second selector rails 24' by the second trenches. In one embodiment, each second selector rail 24' can include an ovonic threshold switch material rail 244' that is a remaining portion of the ovonic threshold switch material layer 244L, an optional second upper barrier material rail 246' that is a remaining portion of an optional second upper barrier material layer 246L, and an optional second lower barrier material rail 242' that is a remaining portion of an optional second lower barrier material layer 242L. Each second selector rail 24' becomes conductive only under electrical bias condition of one polarity, and becomes electrically non-conductive under electrical bias condition of the opposite polarity. Alternatively or additionally, each second selector rail 24' can include a different non-Ohmic element such as a p-n junction diode (not expressly shown). Such a non-Ohmic element can be located in lieu of, or in a series connection with, a respective ovonic threshold switch material rail 244'. Each second metal nitride layer 224L, if present, can be divided into second metal nitride rails 224.

The second trenches are vertically extended through the second metal layer 222L. The second metal layer 222L is divided into multiple disjoined portions, each of which constitutes a second metal rail 222. Each contiguous combination of a second metal nitride rails 224 and a second metal rail 222 collectively constitutes a second conductive rail 22. Portions of the top surface of the substrate 8 can be physically exposed at the bottom of the second trenches.

An anisotropic etch process is performed to vertically extend the second trenches through the levels of the first barrier rails 18', the first phase change material rails 16', the first selector rails 14', and upper portions of the first dielectric isolation structures 15, and optionally through the first metal nitride rails 124'. Each stack of a first barrier rail 18', a first phase change memory rail 16', and a first selector rail 14' is divided into a respective row of first pillar structures (14, 16, 18).

Each first pillar structure (14, 16, 18) includes a first phase change memory element 16 that is a patterned portion of a first phase change memory rail 16' and a first selector element 14 that is a patterned portion of a first selector rail 14', and optionally includes a first barrier element 18 that is a patterned portion of a first barrier rail 18'. Each first phase change memory element 16 can include a phase change memory material portion 164 that is a patterned portion of the phase change memory material rail 164', an optional first upper conductive liner portion 166 that is a patterned portion of a first upper conductive liner rail 166', and an optional first lower conductive liner portion 162 that is a patterned portion of a first lower conductive liner rail 162'. Each first selector element 14 can include an ovonic threshold switch material portion 144 which is a patterned portion of an ovonic threshold switch material rail 144', an optional first upper barrier material portion 146 that is a patterned portion of a first upper barrier material rail 146', and an optional first lower barrier material portion 142 that is a patterned portion of a first lower barrier material rail 142'.

In one embodiment, each first selector element 14 can include an upper amorphous carbon portion that contacts a top surface of an ovonic threshold switch material portion 144 as a first upper barrier material portion 146, and a lower amorphous carbon portion that contacts a bottom surface of the ovonic threshold switch material portion 144 as a first lower barrier material portion 142. Each first selector element 14 becomes conductive only under electrical bias condition of one polarity, and becomes electrically nonconductive under electrical bias condition of the opposite polarity. Alternatively or additionally, each first selector element 14 can include a different non-Ohmic element such as a p-n junction diode (not expressly shown). Such a non-Ohmic element can be located in lieu of, or in a series connection with, a respective ovonic threshold switch material portion 144. Each first metal nitride rail 124', if present, may be divided into first metal nitride portions 124. Each of the first conductive rails 12 can include a respective first metal rail 122 and first metal nitride rails 124.

Each first selector element 14 can be in a series connection with a first phase change memory element 16 within the same first pillar structure (14, 16, 18). Each first phase change memory element 16 can be a pillar structure having a rectangular horizontal cross-sectional shape. Each first selector element 14 can be a pillar structure having a rectangular horizontal cross-sectional shape. Each first barrier element 18 can be a pillar structure having a rectangular horizontal cross-sectional shape. Each row of first pillar structures (14, 16, 18) can be laterally spaced among one another by the second trenches. The top surfaces of the first conductive rails 12 can function as an etch stop surface. Thus, the etch process that forms the second trenches can stop on the top surfaces of the first metal rails 122, and therefore, the first conductive rails 12 are not divided into multiple portions by the second trenches, i.e., remain as a single continuous structure.

Each first pillar structure (14, 16, 18) can have a respective rectangular horizontal cross-sectional shape. A two-dimensional array of first pillar structures (14, 16, 18) is formed between the first conductive rails 12 and the second conductive rails 22. The level of the first pillar structures (14, 16, 18) defines a first array level that includes a first two-dimensional array of memory elements, each including a respective set of a first phase change memory element 16 and a first selector element 14 in a series connection.

Each first dielectric isolation structures 15 can be etched through the levels of the first pillar structures (14, 16, 18), and not etched at the level of the first conductive rails 12. Each remaining portion of a first dielectric isolation structure 15 can include a laterally extending portion located at the level of the first conductive rails 12 and contacting at least one first conductive rail 12, and vertical portions protruding upward from the laterally extending portion and contacting a respective neighboring pair of first pillar structures (14, 16, 18). As such, each first dielectric isolation structure 15 can have a fork configuration with fingers that separate neighboring pairs of first pillar structures (14, 16, 18). The second trenches laterally separate neighboring pairs of forks, i.e., vertically protruding portions, of each first dielectric isolation structure 15.

A dielectric material such as silicon oxide can be conformally deposited in the second trenches. Excess portions of the dielectric material can be removed from above the second stacked rail structures (22, 24', 26', 28') by a planarization process such as chemical mechanical planarization or a recess etch.

Remaining portions of the dielectric material in the second trenches constitute second dielectric isolation structures 25. The second dielectric isolation structures 25 can be rail structures that laterally extend along the first horizontal direction hd1. The second dielectric isolation structures 25 vertically extend from the level of the second stacked rail structures (22, 24', 26', 28') to top surfaces of the first conductive rails 12. Specifically, the second dielectric isolation structures 25 vertically extend from a horizontal plane including the topmost surfaces of the second stacked rail structures (22, 24', 26', 28') to top surfaces of the first conductive rails 12. In one embodiment, the second dielectric isolation structures 25 can have a homogeneous composition throughout, which is herein referred to as a second homogeneous composition. The set of first dielectric isolation structures 25 can vertically extend continuously through two vertically neighboring array levels. Each of the first pillar structures (14, 16, 18) contacts a top surface of a respective one of the first conductive rails 12 and a bottom surface of a respective one of the second conductive rails 22.

A second insulating spacer 23 including various second insulating spacer sublayers can be formed by depositing and anisotropically etching various conformal insulating layers between the various anisotropic etch steps that form the second trenches. In one embodiment, each second insulating spacer 23 can include a contiguous combination of a second outer insulating liner 232, a second dielectric oxide insulating liner 234, a second intermediate insulating liner 236, a second inner insulating liner 238, and a second dielectric fill liner 239, or any subset thereof.

In one embodiment, each of the second insulating spacers 23 includes a single insulating liner at a first array level including an array of first pillar structures (14, 16, 18) and includes a plurality of insulating liners at a second array level in which an array of second pillar structures is to be subsequently formed. Generally, each of the insulating spacers includes a single insulating liner at a lower array level within the two vertically neighboring array levels and includes a plurality of insulating liners at an upper array level within the two vertically neighboring array levels.

Figure 17:
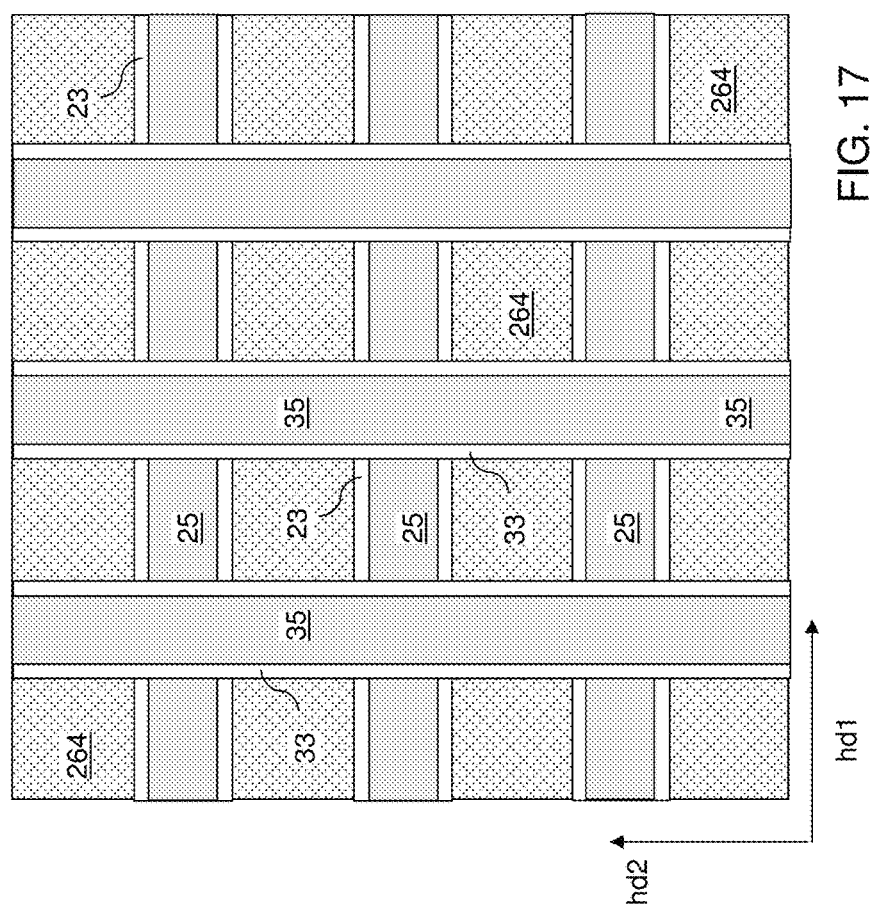
FIG. 17 is a horizontal cross-sectional view of the exemplary structure at a second array level after the processing steps of FIG. 6.

Subsequent processing steps can be performed as illustrated in FIGS. 6-12. FIG. 17 illustrates a horizontal cross-sectional view of the exemplary structure at the second memory level after formation of third dielectric isolation structures 35. The processing steps for forming the structures of the first array level and the second array level can be repeatedly employed to form higher array level structures.

The various liners within each of the first insulating spacers 13 are optional, and the first insulating spacers 13 are optional. The various liners within each of the second insulating spacers 23 are optional, and the second insulating spacers 23 are optional. Generally, similar insulating spacers may be employed at upper memory levels, and the various component liners within such insulating spacers are optional. If present, the various liners in the insulating spacers protect sidewalls of covered structures during an anisotropic etch process and/or prevent diffusion of contaminants and/or hydrogen therethrough.

Generally, insulating spacers (such as the second insulating spacers 23) vertically extending continuously through two vertically neighboring array levels and contacting a sidewall of a respective one of underlying dielectric isolation structures (such as the first dielectric isolation structures 15) and embedding a respective dielectric isolation structures (such as the second dielectric isolation structures 25) can be provided. Each of such insulating spacers (such as the second insulating spacers 23) can contact sidewalls of a respective subset of pillar structures (such as the first pillar structures (14, 16, 18) and the second pillar structures (24, 26, 28)) located at each array level within the two vertically neighboring array levels upon formation of the pillar structures in the upper level. In some embodiments, each of such insulating spacers (such as the second dielectric isolation structures 25) can include a single insulating liner (such as a second dielectric fill liner 239) at a lower array level within the two vertically neighboring array levels and can include a plurality of insulating liners (such as a combination of a second outer insulating liner 232, a second dielectric oxide insulating liner 234, a second intermediate insulating liner 236, a second inner insulating liner 238, and a second dielectric fill liner 239) at an upper array level within the two vertically neighboring array levels.

Figure 18:
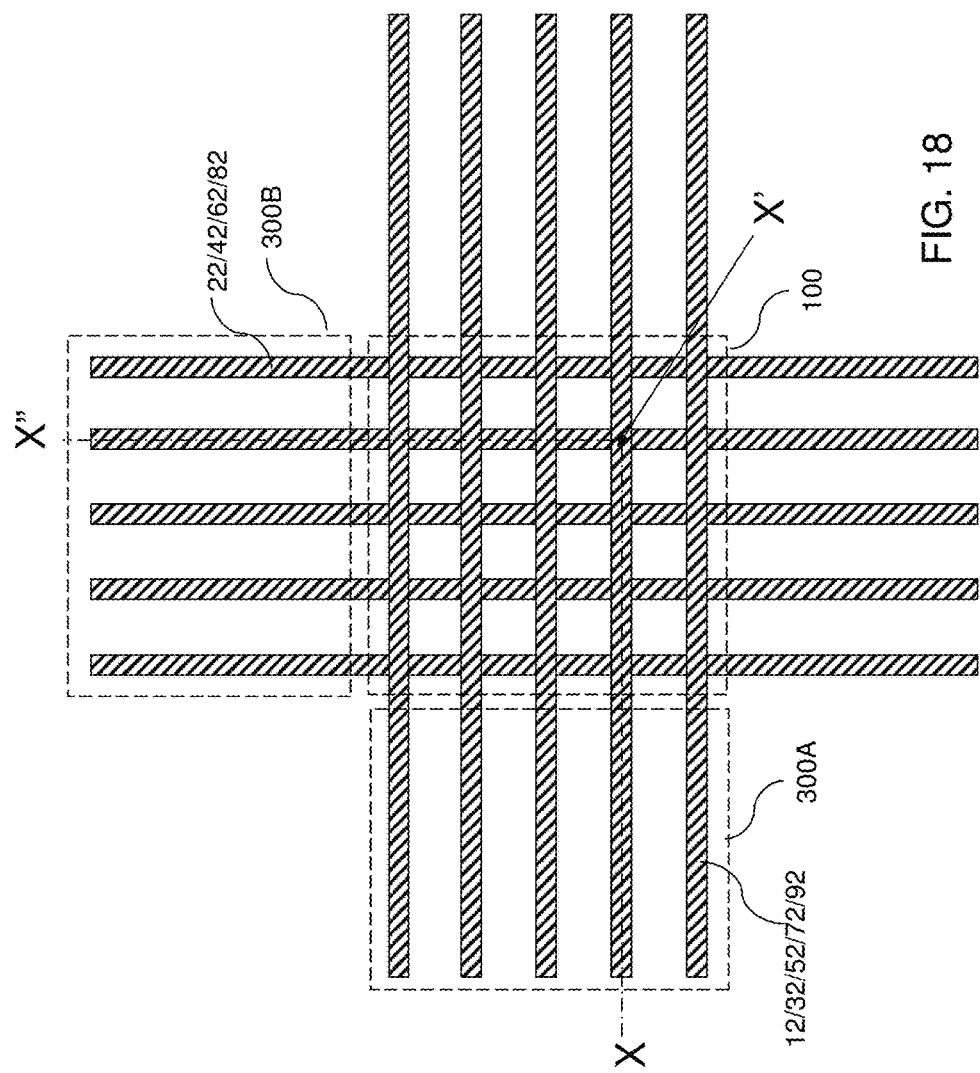
FIG. 18 is a schematic see-through horizontal cross-sectional view of the exemplary structure after the processing steps of FIG. 12.
Figure 19:
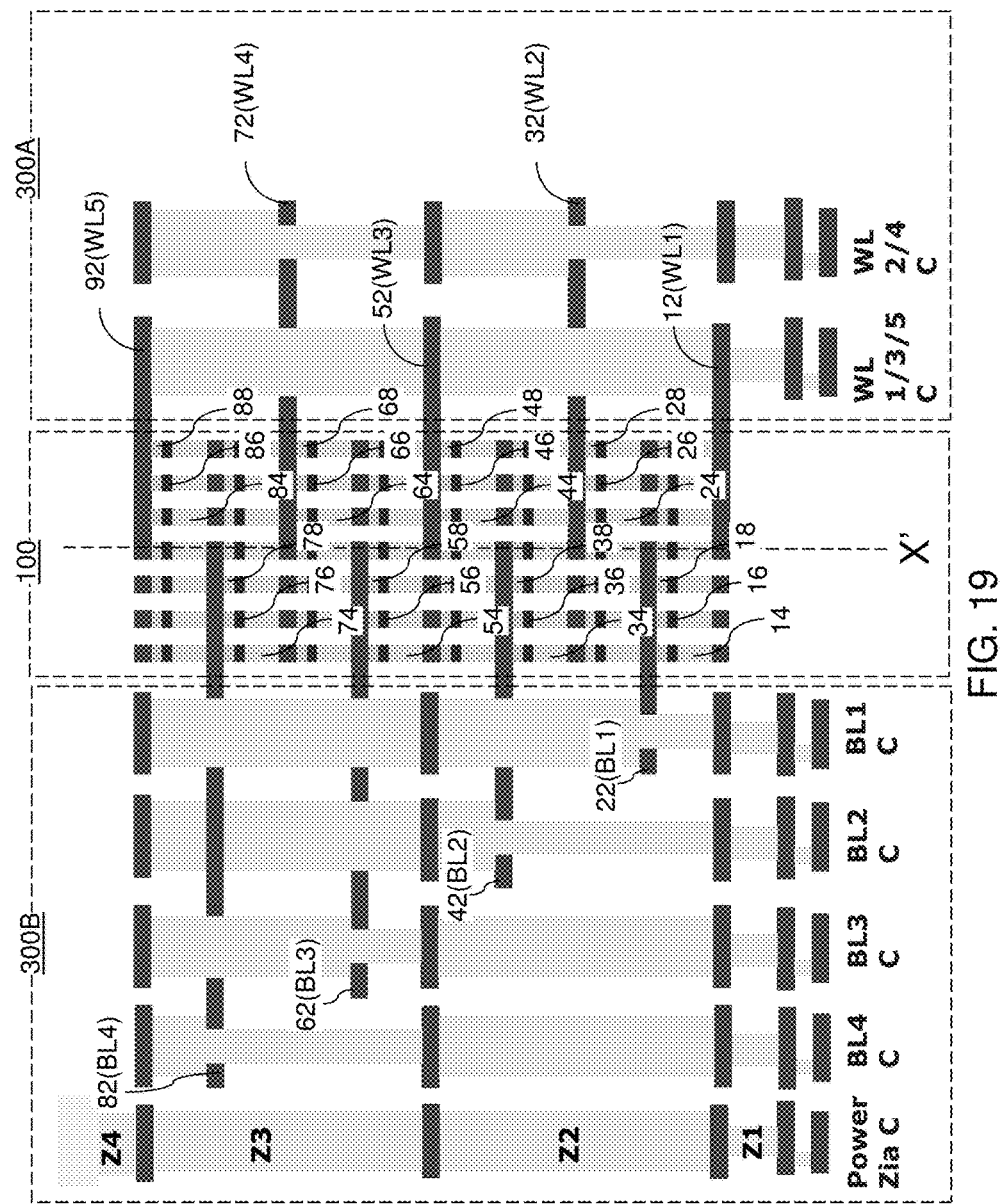
FIG. 19 is a schematic vertical cross-sectional view of a first configuration of the exemplary structure after completion of processing steps.
Figure 20:
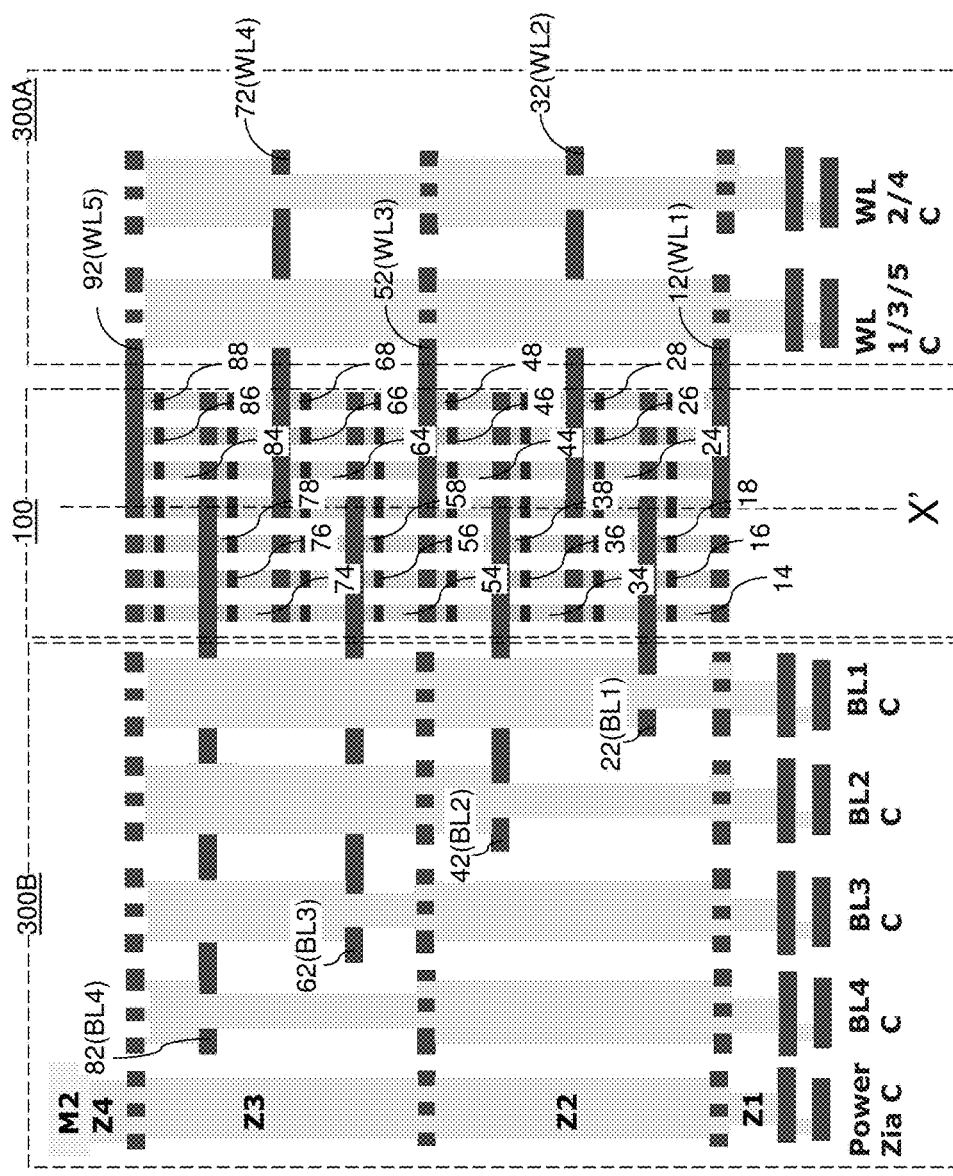
FIG. 20 is a schematic vertical cross-sectional view of a second configuration of the exemplary structure after completion of processing steps.
Figure 21:
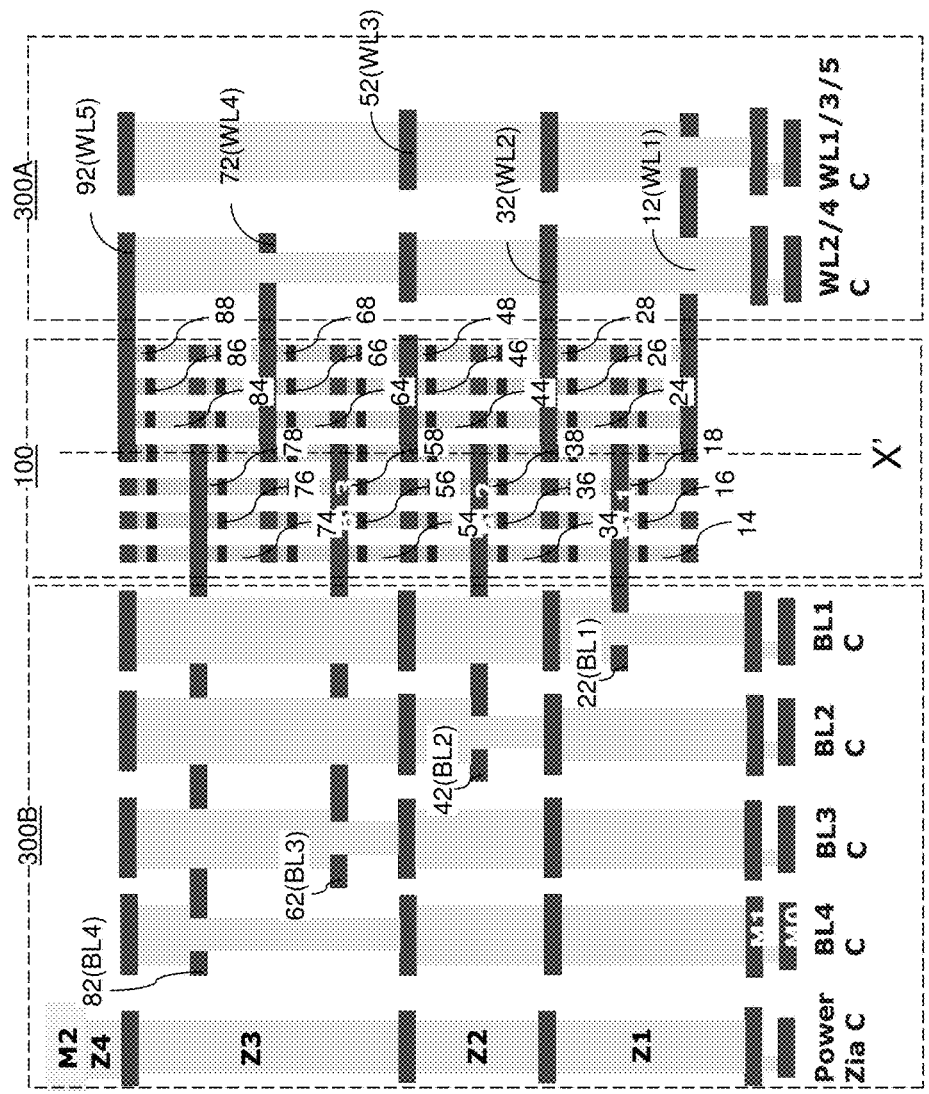
FIG. 21 is a schematic vertical cross-sectional view of a third configuration of the exemplary structure after completion of processing steps.
Figure 22:
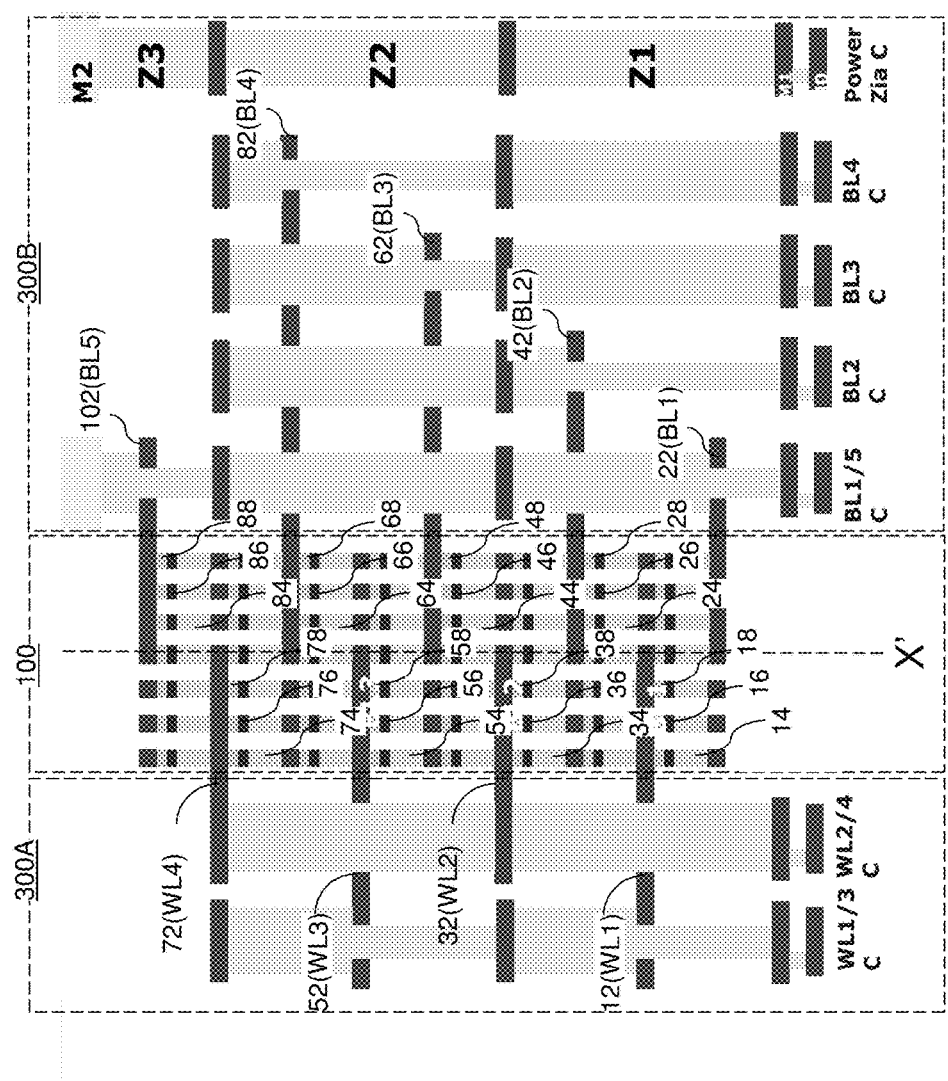
FIG. 22 is a schematic vertical cross-sectional view of a fourth configuration of the exemplary structure after completion of processing steps.

In one embodiment, odd-level conductive rails (such as first conductive rails 12, third conductive rails 32, etc.) can function as word lines, and even-level conductive rails (such as second conductive rails 22, fourth conductive rails 42, etc.) can function as bit lines. Alternatively, odd-level conductive rails (such as first conductive rails 12, third conductive rails 32, etc.) can function as bit lines, and even-level conductive rails (such as second conductive rails 22, fourth conductive rails 42, etc.) can function as word lines. Electrical connections to the word lines and the bit lines can be connected in peripheral regions 300, which can be located on at least two sides of each memory array region 100. FIG. 18 illustrates a configuration in which a first peripheral region (e.g., word line contact region) 300A provides electrical connection to odd-level conductive rails (such as first conductive rails 12, third conductive rails 32, etc.), and a second peripheral region 300B (e.g., bit line contact region) provides electrical connection to even-level conductive rails (such as second conductive rails 22, fourth conductive rails 42, etc.).

FIGS. 19-22 provide various configurations for providing electrical connection in schematic cross-sectional view. The angled cut plane X-X" of the cross-sectional views of FIGS. 32-35 is illustrated in FIG. 18. The vertical axis X' is the axis about which the angled cut plane rotates by 90 degrees.

In FIGS. 19-22, BL1, BL2, BL3, and BL4 represent first bit lines, second bit lines, third bit lines, and fourth bit lines, respectively. WL1, WL2, WL3, WL4, and WL5 represent first word lines, second word lines, third word lines, fourth word lines, and fifth word lines, respectively. WL1/3/5 C and WL2/4 C represent contact structures to first, third, and fifth word lines and contact structures to second and fourth word lines, respectively. BL1 C, BL2 C, BL3 C, and BL4 C represent contact structures to first, second, third, and fourth bit lines, respectively. Similar naming conventions apply to similar labels for various contact structures. Power Zia C represents contact structures for power interconnect structures to zias Z1, Z2, Z3 and Z4. The configurations in FIGS. 32-35 are only illustrative, and many different configurations can be employed to provide electrical connection to various word lines and bit lines of the exemplary structure of the present disclosure.

Referring to all the drawings and according to various embodiments of the present disclosure, a phase change memory device is provided, which comprises a vertical stack of multiple two-dimensional arrays of pillar structures {(14, 16, 18), (24, 26, 28), etc.}, wherein: each of the multiple two-dimensional arrays of pillar structures {(14, 16, 18), (24, 26, 28), etc.} is located within a respective array level; each two-dimensional array among the multiple two-dimensional arrays of pillar structures {(14, 16, 18), (24, 26, 28), etc.} is contacted by a respective overlying one-dimensional array of conductive rails (22, 32, etc.) laterally extending along a one horizontal direction and a respective underlying one-dimensional array of conductive rails (12, 22, etc.) laterally extending along another, different horizontal direction; each pillar structure {(14, 16, 18), (24, 26, 28), etc.} within the multiple two-dimensional arrays of pillar structures {(14, 16, 18), (24, 26, 28), etc.} comprises a phase change memory element (16, 26, etc.) and a selector element (14, 24, etc.) in a series connection with the phase change memory element (16, 26, etc.); and a first set of dielectric isolation structures (25, 35, etc.) having a first homogeneous composition vertically extends continuously through two vertically neighboring array levels.

In one embodiment, the phase change memory device further comprises a second set of dielectric isolation structures (e.g., third dielectric isolation structures 35) having a second homogeneous composition and located at one of the two vertically neighboring array levels through which the first set of dielectric isolation structures (e.g., second dielectric isolation structures 25) extend, wherein each pillar structure (such as the second pillar structures (24, 26, 28) located at the one of the two vertically neighboring array levels is laterally electrically isolated by a pair among the first set of dielectric isolation structures (e.g., second dielectric isolation structures 25) and a pair among the second set of dielectric isolation structures (e.g., third dielectric isolation structures 35).

In one embodiment, the multiple two-dimensional arrays of pillar structures {(14, 16, 18), (24, 26, 28), etc.} comprise three or more two-dimensional arrays of pillar structures, and the second set of dielectric isolation structures (e.g., third dielectric isolation structures 35) vertically extend through another array level (e.g., the third array level) that is different from the two vertically neighboring array levels (e.g., the first array level and the second array level).

In one embodiment, the phase change memory device further comprises insulating spacers (e.g., second insulating spacers 23) vertically extending continuously through the two vertically neighboring array levels and contacting a sidewall of a respective one among the first set of dielectric isolation structures (e.g., second dielectric isolation structures 25). In one embodiment, each of the insulating spacers (e.g., second insulating spacers 23) contacts sidewalls of a respective subset of the pillar structures {(14, 16, 18), (24, 26, 28)} located at each array level within the two vertically neighboring array levels. In one embodiment, each of the insulating spacers (e.g., second insulating spacers 23) includes a single insulating liner (such as a second dielectric fill liner 239) at a lower array level within the two vertically neighboring array levels and includes a plurality of insulating liners (such as a combination of a second outer insulating liner 232, a second dielectric oxide insulating liner 234, a second intermediate insulating liner 236, a second inner insulating liner 238, and a second dielectric fill liner 239) at an upper array level within the two vertically neighboring array levels.

In one embodiment, an overlying one-dimensional array of conductive rails (such as the second conductive rails 22) for a lower array level within the two vertically neighboring array levels and an underlying one-dimensional array of conductive rails (such as the second conductive rails 22) for an upper array level within the two vertically neighboring array levels are embodied as a single set of conductive rails (such as the second conductive rails 22) located between the two vertically neighboring array levels. In other words, the two vertically neighboring array levels share a common one-dimensional array of conductive rails (e.g., 22). The overlying one-dimensional array of conductive rails 22 comprise bit lines laterally extending along the first horizontal direction hd1, and the respective underlying one-dimensional array of conductive rails 12 comprises word lines laterally extending along the second horizontal direction hd2 which is perpendicular to the first horizontal direction.

In one embodiment, the first set of dielectric isolation structures (e.g., second dielectric isolation structures 25) vertically extends through the single set of conductive rails (such as the second conductive rails 22), wherein each neighboring pair of among the single set of conductive rails (such as the second conductive rails 22) is laterally spaced from each other by a respective one among the first set of dielectric isolation structures (e.g., second dielectric isolation structures 25).

In one embodiment, each selector element (16, 26, etc.) comprises: an ovonic threshold switch material portion (164, 264, etc.); an upper amorphous carbon portion (166, 266, etc.) that contacts a top surface of the ovonic threshold switch material portion; and a lower amorphous carbon portion (162, 262) that contacts a bottom surface of the ovonic threshold switch material portion. In one embodiment, each pillar structure {(14, 16, 18), (24, 26, 28), etc.} within the multiple two-dimensional arrays of pillar structures further comprises a barrier element (18, 28, etc.) located between the phase change memory element (16, 26, etc.) and a most proximal one of the conductive rails (22, 32, etc.).

In one embodiment, each pillar structure {(14, 16, 18), (24, 26, 28), etc.} within the multiple two-dimensional arrays of pillar structures has a rectangular horizontal cross-sectional shape of a variable area that is lesser at a level of a phase change memory element (16, 26, etc.) thereof than at a level of an ovonic threshold memory portion (14, 24, etc.) thereof due to the lateral recessing performed on the phase change memory element (16, 26, etc.).

The present disclosure provides a phase change memory device employing a three-dimensional array of pillar structures in which electrical current flows vertically. Each pillar structure includes a selector element to enable selection of a phase change memory element through selection of a pair of a word line and a bit line, and thus, can provide a compact three-dimensional phase change memory structure.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A phase change memory device comprising a vertical stack of multiple two-dimensional arrays of pillar structures, wherein:

each of the multiple two-dimensional arrays of pillar structures is located within a respective array level;

each two-dimensional array among the multiple two-dimensional arrays of pillar structures is contacted by a respective overlying one-dimensional array of conductive rails laterally extending along a first horizontal direction and a respective underlying one-dimensional array of conductive rails laterally extending along a second horizontal direction different from the first direction;

each pillar structure within the multiple two-dimensional arrays of pillar structures comprises a phase change memory element and a selector element in a series connection with the phase change memory element; and a first set of dielectric isolation structures having a first homogeneous composition vertically extends continuously through two vertically neighboring array levels;

wherein:

each selector element comprises an ovonic threshold switch material portion;

each selector element further comprises an upper amorphous carbon portion that contacts a top surface of the ovonic threshold switch material portion, and a lower amorphous carbon portion that contacts a bottom surface of the ovonic threshold switch material portion; and each pillar structure within the multiple two-dimensional arrays of pillar structures further comprises a barrier element located between the phase change memory element and a most proximal one of the conductive rails.

2. The phase change memory device of claim 1, further comprising a second set of dielectric isolation structures having a second homogeneous composition and located at one of the two vertically neighboring array levels through which the first set of dielectric isolation structures extend, wherein each pillar structure located at the one of the two vertically neighboring array levels is laterally electrically isolated by a pair among the first set of dielectric isolation structures and a pair among the second set of dielectric isolation structures.

3. The phase change memory device of claim 2, wherein the multiple two-dimensional arrays of pillar structures comprise three or more two-dimensional arrays of pillar structures, and the second set of dielectric isolation structures vertically extend through another array level that is different from the two vertically neighboring array levels.

4. The phase change memory device of claim 1, further comprising insulating spacers vertically extending continuously through the two vertically neighboring array levels and contacting a sidewall of a respective one among the first set of dielectric isolation structures.

5. The phase change memory device of claim 4, wherein each of the insulating spacers contacts sidewalls of a respective subset of the pillar structures located at each array level within the two vertically neighboring array levels.

6. The phase change memory device of claim 5, wherein each of the insulating spacers includes a single insulating liner at a lower array level within the two vertically neighboring array levels and includes a plurality of insulating liners at an upper array level within the two vertically neighboring array levels.

7. The phase change memory device of claim 1, wherein:
the two vertically neighboring array levels share a common one-dimensional array of conductive rails;

the overlying one-dimensional array of conductive rails comprise bit lines laterally extending along the first horizontal direction; and the respective underlying one-dimensional array of conductive rails comprises word lines laterally extending along the second horizontal direction which is perpendicular to the first horizontal direction.

8. The phase change memory device of claim 7, wherein the first set of dielectric isolation structures vertically extends through the single set of conductive rails, wherein each neighboring pair of among the single set of conductive rails is laterally spaced from each other by a respective one among the first set of dielectric isolation structures.

9. The phase change memory device of claim 1, wherein each pillar structure within the multiple two-dimensional arrays of pillar structures has a rectangular horizontal cross-sectional shape of a variable area that is lesser at a level of a phase change memory element thereof than at a level of an ovonic threshold memory portion thereof.

10. A method of manufacturing a phase change memory device, comprising:

forming first stacked rail structures laterally spaced in a first horizontal direction by first trenches over a substrate, wherein each of the first stacked rail structures comprises a first conductive rail, a first selector rail, and a first phase change material rail;

forming first dielectric isolation structures in the first trenches;

forming second stacked rail structures laterally spaced in a second horizontal direction different from the first horizontal direction by second trenches over the first stacked rail structures and the first dielectric isolation structures, wherein each of the second stacked rail structures comprises a second conductive rail, a second selector rail, and a second phase change memory rail; and vertically extending the second trenches through the first phase change material rails, the first selector rails, and upper portions of the first dielectric isolation structures to form first pillar structures including a respective first phase change memory element and a respective first selector element by patterning the first phase change material rails and the first selector rails;

wherein:

each selector element comprises an ovonic threshold switch material portion;

each selector element further comprises an upper amorphous carbon portion that contacts a top surface of the ovonic threshold switch material portion, and a lower amorphous carbon portion that contacts a bottom surface of the ovonic threshold switch material portion; and each of the first pillar structures comprises a barrier element located between the phase change memory element and a most proximal one of the first and second conductive rails.

11. The method of claim 10, further comprising forming second dielectric isolation structures in the second trenches, wherein the second dielectric isolation structures vertically extend from a level of the second stacked rail structures to top surfaces of the first conductive rails.

12. The method of claim 11, further comprising:

forming third stacked rail structures laterally spaced in the first horizontal direction by third trenches over the second stacked rail structures and the second dielectric isolation structures, wherein each of the third stacked rail structures comprises a third conductive rail, a third phase change material rail, and a third selector rail;

vertically extending the third trenches through the second phase change memory rails, the second selector rails, and upper portions of the second dielectric isolation structures to form second pillar structures including a respective second phase change memory element and a respective second selector element by patterning the second phase change memory rails and the second selector rails; and forming third dielectric isolation structures in the third trenches, wherein the second dielectric isolation structures vertically extend from a level of the third stacked rail structures to top surfaces of the second conductive rails.

13. The method of claim 10, wherein:

each of the first pillar structures contacts a top surface of a respective one of the first conductive rails and a bottom surface of a respective one of the second conductive rails;

the first stacked rail structures comprise word lines which laterally extend along a second horizontal direction;

the second stacked rail structures comprise bit lines which laterally extend along the first horizontal direction which is perpendicular to the second horizontal direction; and the first pillar structures have a respective rectangular horizontal cross-sectional shape.

14. The method of claim 10, further comprising forming first insulating spacers in the first trenches prior to forming the first dielectric isolation structures.

15. The method of claim 14, further comprising forming second insulating spacers in the second trenches after vertically extending the second trenches.

* * * * *